(12) United States Patent
Hsueh et al.

(10) Patent No.: US 12,727,482 B2
(45) Date of Patent: Sep. 1, 2026

(54) WARPAGE MODULATION THROUGH IMPLANTATION AND THE STRUCTURES THEREOF

(71) Applicant: Taiwan Semiconductor Manufacturing Co., Ltd., Hsinchu (TW)

(72) Inventors: Yang-Chih Hsueh, Hsinchu (TW); Yan-Zuo Tsai, Hsinchu (TW); Ming-Tsu Chung, Hsinchu (TW); Yung-Chi Lin, Su-Lin City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 393 days.

(21) Appl. No.: 18/503,853

(22) Filed: Nov. 7, 2023

(65) Prior Publication Data

US 2025/0062247 A1 Feb. 20, 2025

Related U.S. Application Data

(60) Provisional application No. 63/532,455, filed on Aug. 14, 2023.

(51) Int. Cl.

| | |
|---|---|
| ***H10W 42/00*** | (2026.01) |
| ***H10P 30/40*** | (2026.01) |
| ***H10P 74/20*** | (2026.01) |
| ***H10W 20/43*** | (2026.01) |
| ***H10W 90/00*** | (2026.01) |

(52) U.S. Cl.

CPC ........... *H10W 42/121* (2026.01); *H10P 30/40* (2026.01); *H10P 74/203* (2026.01); *H10W 20/43* (2026.01); *H10W 90/792* (2026.01); *H10W 90/794* (2026.01)

(58) Field of Classification Search

CPC .... H10P 74/203; H10W 42/121; H10W 20/43

See application file for complete search history.

(56) References Cited

U.S. PATENT DOCUMENTS

| | | | |
|---|---|---|---|
| 7,781,851 B2 | 8/2010 | Seo | |
| 9,859,129 B2 | 1/2018 | Kuo et al. | |
| 10,991,509 B2 * | 4/2021 | Nakagawa | H10D 1/665 |
| 11,756,933 B2 | 9/2023 | Chen et al. | |
| 2012/0007252 A1 | 1/2012 | Tseng et al. | |
| 2015/0294917 A1 * | 10/2015 | deVilliers | H10P 30/20 438/7 |
| 2017/0133328 A1 * | 5/2017 | Ranish | H10W 42/121 |
| 2017/0271242 A1 * | 9/2017 | Lo | H10W 20/20 |
| 2020/0295034 A1 | 9/2020 | Suzuki et al. | |

(Continued)

FOREIGN PATENT DOCUMENTS

| | | |
|---|---|---|
| CN | 109119334 A | 1/2019 |
| CN | 111883539 A | 11/2020 |

(Continued)

*Primary Examiner* — Steven M Page

(74) *Attorney, Agent, or Firm* — Slater Matsil, LLP

(57) ABSTRACT

A method includes depositing a dielectric layer on a package component having a first warpage, and performing an implantation process to implant the dielectric layer with a stress modulation dopant. After the implantation process, the package component has a second warpage smaller than the first warpage.

20 Claims, 28 Drawing Sheets

(56) References Cited

U.S. PATENT DOCUMENTS

| | | | |
|---|---|---|---|
| 2021/0005527 A1 | 1/2021 | Choi et al. | |
| 2024/0113413 A1 | 4/2024 | Tang et al. | |
| 2024/0266233 A1* | 8/2024 | Lee | H10P 74/203 |

FOREIGN PATENT DOCUMENTS

| | | | |
|---|---|---|---|
| CN | 113921389 | A | 1/2022 |
| JP | 2011216828 | A | 10/2011 |
| KR | 20060082496 | A | 7/2006 |
| TW | 201203476 | A | 1/2012 |
| TW | 201731101 | A | 9/2017 |
| TW | 202103276 | A | 1/2021 |
| TW | 202247371 | A | 12/2022 |
| TW | I807289 | B | 7/2023 |
| WO | 2019021817 | A1 | 1/2010 |

* cited by examiner 18
20
20
20
20
46
44
42
32-I(32)
30
48
49
48
49
26
24
26
32-UI(32)
25
28
34
25

WARPAGE MODULATION THROUGH IMPLANTATION AND THE STRUCTURES THEREOF

PRIORITY CLAIM AND CROSS-REFERENCE

This application claims the benefit of the following provisionally filed U.S. patent application: Application No. 63/532,455, filed on Aug. 14, 2023, and entitled "Warpage Modulation via Ion Implantation for Bond Yield Improvement," which application is hereby incorporated herein by reference.

BACKGROUND

Integrated circuit packages may have a plurality of package components such as device dies and package substrates bonded together to increase the functionality and integration level. Due to the differences between different materials of the plurality of package components, warpage may occur. The warpage may cause non-bond issues, and some conductive features that are intended to be bonded to each other are not bonded, causing circuit failure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B, 1C:
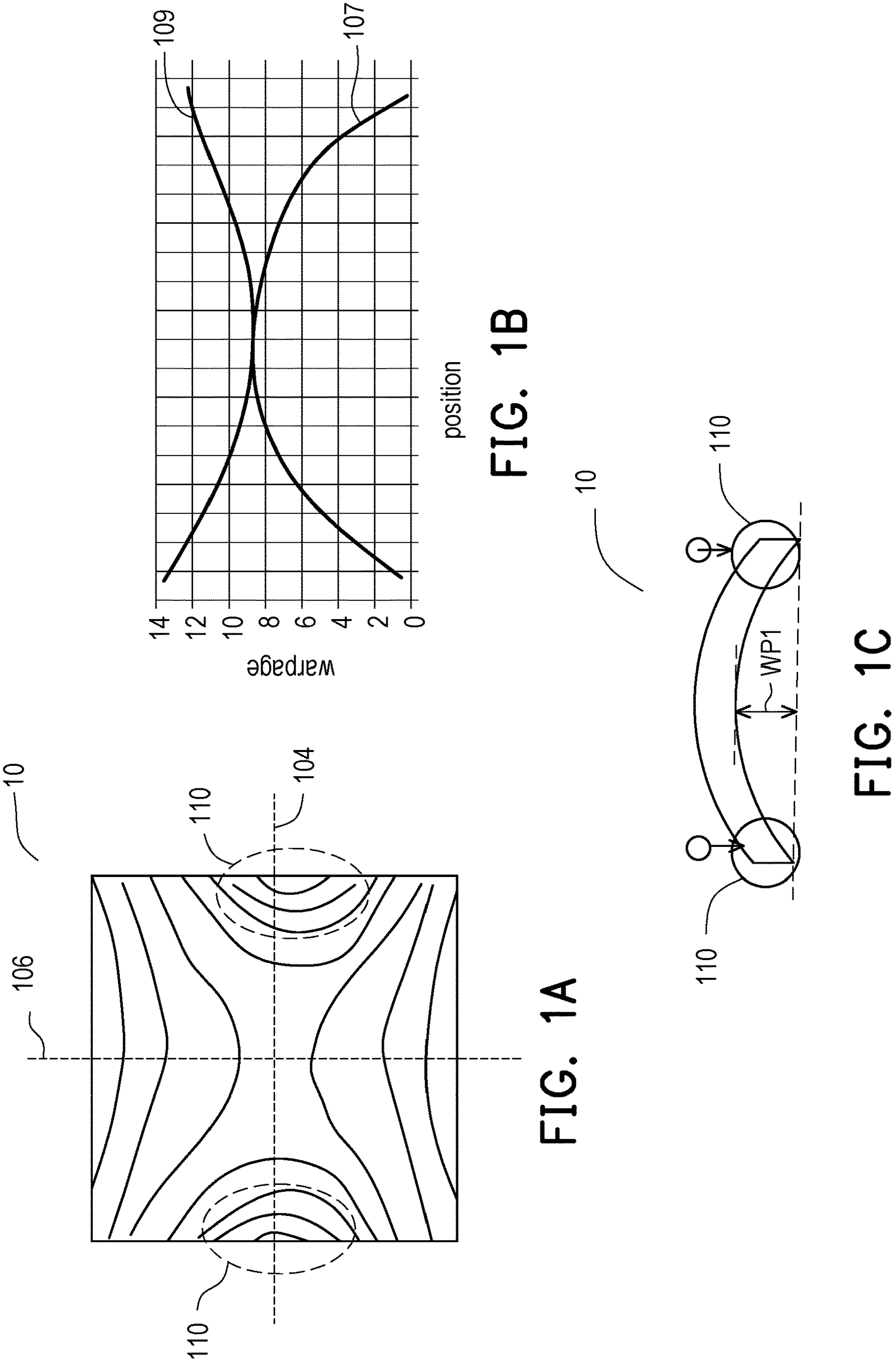
FIG. 1A illustrates contour lines of a die with warpage in accordance with some embodiments.
FIG. 1B illustrates the warpage of a die measured in two directions in accordance with some embodiments.
FIG. 1C illustrates a cross-sectional view of a die with a crying profile in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming stress modulation layers and/or regions (referred to as layers/regions hereinafter) to reduce warpage of package components and the resulting structures are provided. In accordance with some embodiments of the present disclosure, a package component such as a die or a wafer is measured to determine the warpage of a package component. Implantation processes are performed to implant stress modulation dopant and to form stress modulation layers/regions, so that the warpage is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1A illustrates a top view of a package component 10, which may be a device die in accordance with some embodiments. Contour lines are illustrated to represent the warpage profile, wherein each contour line represents the positions that are on the same level. For example, if the package component is placed on a planar surface, some points of the package component contact the planar surface, with zero distance from the planar surface. Due to the warpage, some parts of the package component may be higher than, and are spaced apart from the planar surface. The contour lines may represent the distances of different parts of the package component from the planar surface.

Figures 2A, 2B:
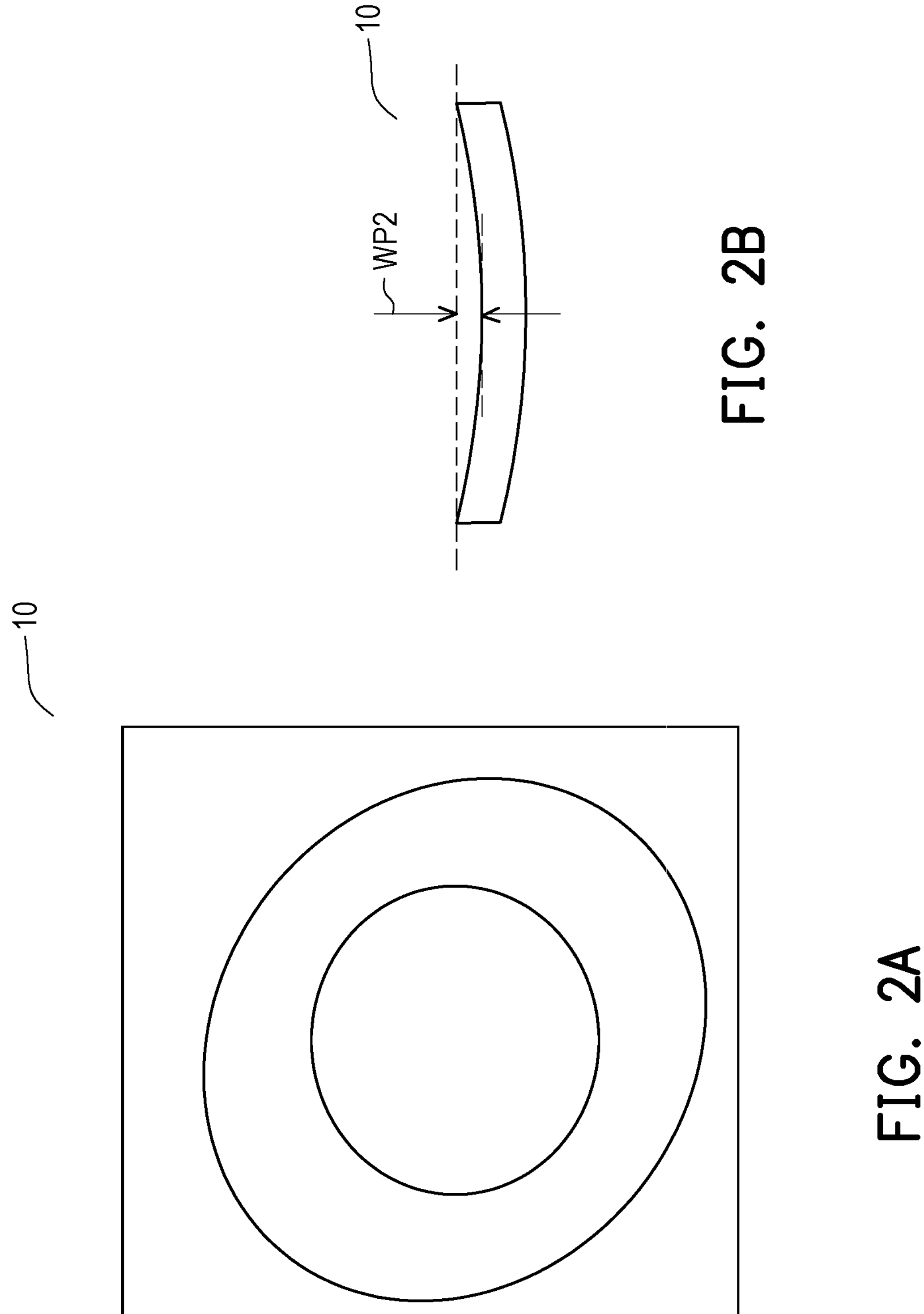
FIG. 2A illustrates contour lines of a die received implantation for reducing warpage in accordance with some embodiments.
FIG. 2B illustrates a cross-sectional view of a die received implantation for reducing warpage in accordance with some embodiments.

FIG. 1B illustrates an example warpage profile measured from package component 10. Line 107 in FIG. 1B is obtained from the cross-section 104 in FIG. 1A, and line 109 in FIG. 1B is obtained from the cross-section 106 in FIG. 1A. Line 107 indicates that the edge portions of package component 10 are lower than the center portion of package component 10. The corresponding profile is referred to as a crying profile. An example crying profile is illustrated in FIG. 1C. Line 109 indicates that the edge portion of package component 10 are higher than the center portion of package component 10. The corresponding profile is referred to as a smiling profile. An example smiling profile is illustrated in FIG. 2B.

The crying profile also means that when package component 10 is placed over another package component, the center part of the package component 10 is likely to be spaced apart from the other package component when the edge parts of package component 10 are in contact with the other package component. While both of the crying profile and the smiling profile are undesirable, the crying profile is more undesirable than the smiling profile. It is even more undesirable that in different cross-sections (such as shown in cross-sections 104 and 106 in FIG. 1A), the warpage profiles are opposite to each other, with one being smiling profile, and the other being crying profile.

FIGS. 3 through 9 illustrate the cross-sectional views of intermediate stages in the formation of a package through die-on-wafer bonding in accordance with some embodiments of the present disclosure. The corresponding processes are also reflected schematically in the process flow shown in FIG. 33.

Figure 3:
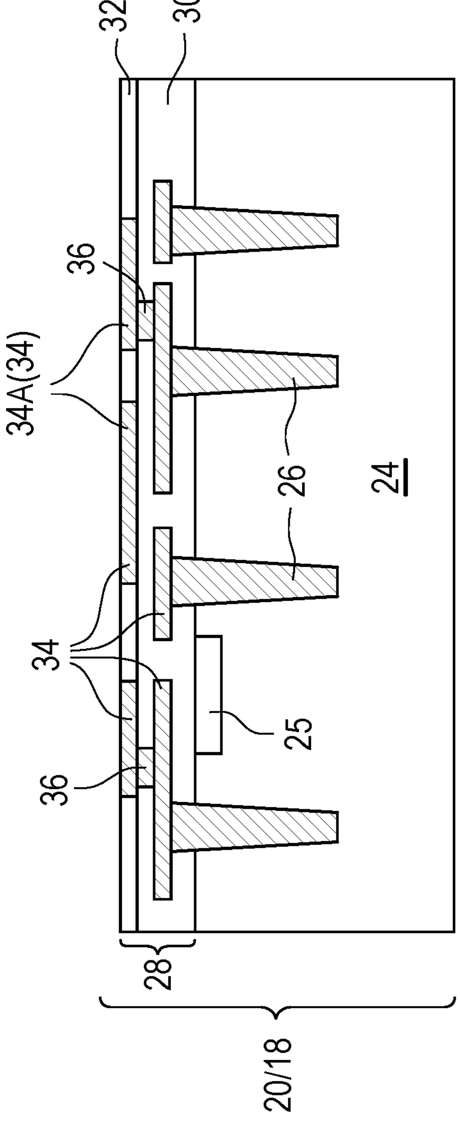
FIGS. 3-9 illustrate the cross-sectional views of intermediate stages in the formation of a package through face-to-face bonding in accordance with some embodiments.

FIG. 3 illustrates a cross-sectional view of package component 20. In accordance with some embodiments, package component 20 is a part of wafer 18, and is a die including active devices and possibly passive devices, which are represented as integrated circuit devices 25. Integrated circuit devices 25 may not be illustrated in subsequent figures, although they may also exist (or not exist). In accordance with alternative embodiments, package component 20 is an interposer die, which is free from active devices, and may or may not include passive devices. In accordance with yet alternative embodiments, package component 20 is or comprises a package such as an Integrated Fan-Out (InFO) Package.

In accordance with some embodiments, package component 20 includes semiconductor substrate 24 and the features formed at a top surface of semiconductor substrate 24. Semiconductor substrate 24 may be formed of or comprise crystalline silicon, crystalline germanium, crystalline silicon germanium, carbon-doped silicon, a III-V compound semiconductor, or the like. Semiconductor substrate 24 may also be a bulk semiconductor substrate or a Semiconductor-On-Insulator (SOI) substrate.

In accordance with some embodiments, package component 20 includes integrated circuit devices, which are formed at the top surface of semiconductor substrate. Integrated circuit devices may include Complementary Metal-Oxide Semiconductor (CMOS) transistors, resistors, capacitors, diodes, and/or the like in accordance with some embodiments. The details of integrated circuit devices are not illustrated herein.

Package component 20 may include through-vias 26 (also referred to as through-silicon vias (TSVs) or through-semiconductor vias (also TSVs)) extending to an intermediate level of semiconductor substrate 24, wherein the intermediate level is between the top surface and the bottom surface of semiconductor substrate 24.

Interconnect structure 28 is formed over semiconductor substrate 24. In accordance with some embodiments, interconnect structure 28 includes a plurality of dielectric layers 30, and a plurality of conductive features such as metal lines/pads 34 and vias 36 in the dielectric layers 30. The dielectric layers 30 may include an Inter-Layer Dielectric (ILD) (not shown separately) that fills the spaces between the gate stacks of transistors in integrated circuit devices 25. In accordance with some embodiments, the ILD is formed of Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, or the like. The ILD may be formed using spin-on coating, Flowable Chemical Vapor Deposition (FCVD), Chemical Vapor Deposition (CVD), or the like.

Dielectric layers 30 may also include low-k dielectric layers (also referred to as Inter-metal Dielectrics (IMDs)) in accordance with some embodiments. The dielectric constants (k values) of the low-k dielectric layers may be lower than about 3.5 or 3.0, for example. The low-k dielectric layers may comprise a carbon-containing low-k dielectric material, Hydrogen SilsesQuioxane (HSQ), MethylSilsesQuioxane (MSQ), or the like.

The conductive features may include contact plugs in the ILD, which contact plugs are used to electrically connect to the integrated circuit devices 25. In accordance with some embodiments, the contact plugs are formed of or comprise a conductive material selected from tungsten, aluminum, copper, titanium, tantalum, titanium nitride, tantalum nitride, alloys therefore, and/or multi-layers thereof.

The conductive features may include metal lines 34 and vias 36, which are formed in the respective dielectric layers 30, and are electrically connected to the integrated circuit devices 25 and through-vias 26. The metal lines at a same level are collectively referred to as a metal layer hereinafter. In accordance with some embodiments, interconnect structure 28 includes a plurality of metal layers interconnected through vias 36. Metal lines 34 and vias 36 may be formed of copper, a copper alloy, and/or another metal.

Interconnect structure 28 may also include a passivation layer 32, which is over, and may be in contact with, an underlying dielectric layer 30. The metal lines/pads 34 in passivation layer 32 are also referred to as top conductive features 34A hereinafter. Passivation layer 32 may be formed of a non-low-k dielectric material, which may comprise silicon and another element(s) including oxygen, nitrogen, carbon, and/or the like. Passivation layer 32 may be expressed as $SiO_xN_yC_z$, with x being in the range between about 0 and about 2, y being in the range between about 0 and about 1.33, and z being in the range between about 0 and about 1, and x, y, and z will not be all equal to zero. For example, passivation layer 32 may be formed of or comprises SiON, SiN, SiOCN, SiCN, SiOC, SiC, or the like.

Figure 4:
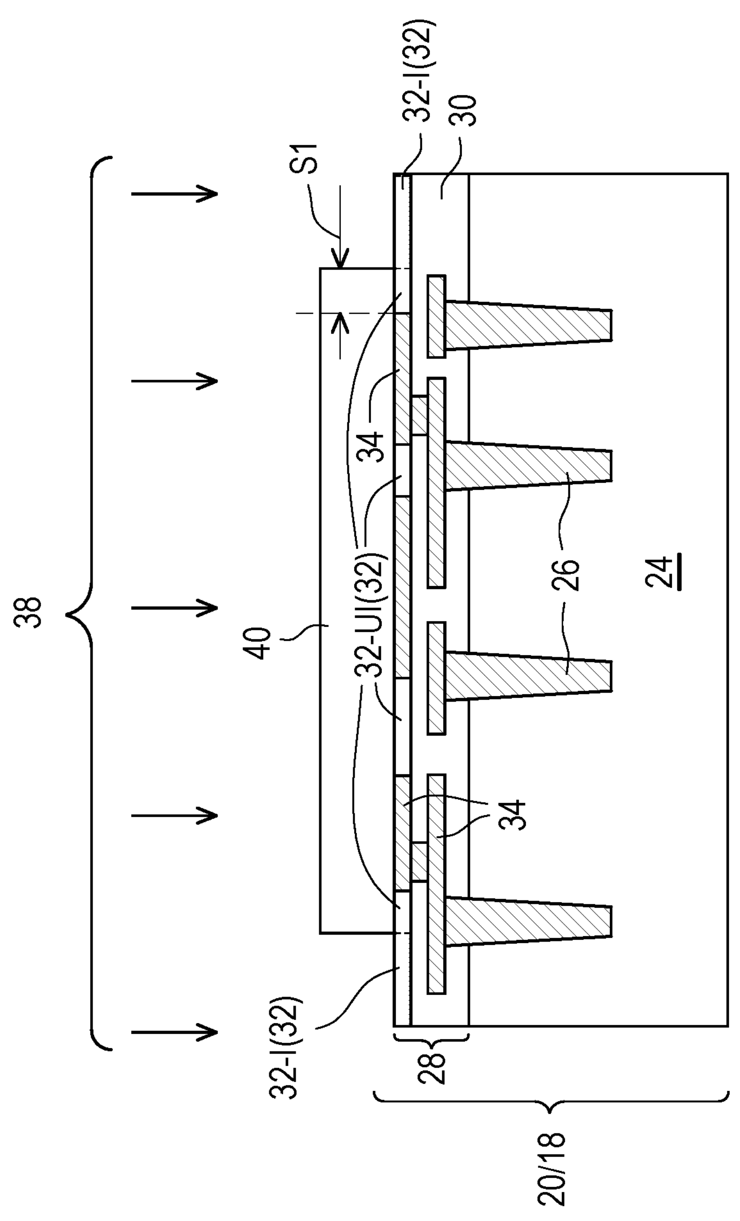

FIG. 4 illustrates the implantation process 38 to form stress modulation regions in passivation layer 32 in accordance with some embodiments. In accordance with alternative embodiments, the implantation process 38 is not performed, and hence no stress modulation regions are formed in passivation layer 32.

Figure 33:
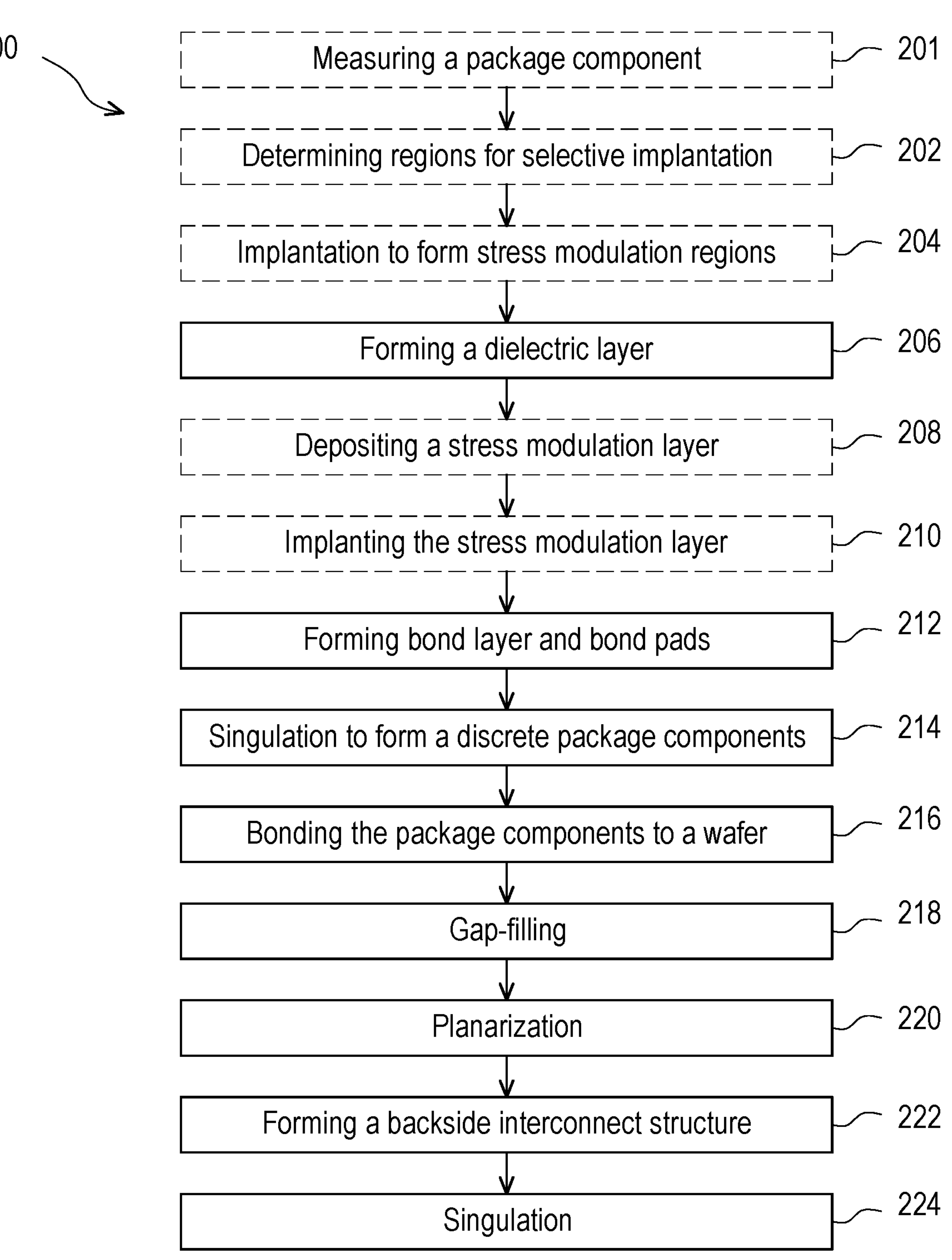
FIG. 33 illustrates a process flow for forming a package including a stress modulation layers or regions in accordance with some embodiments.

Before the implantation process 38, the parts of passivation layer 32 to be implanted is determined. In accordance with some embodiments, the warpage of package component 20 is measured. Alternatively, a sample package component that has an identical structure as package component 20 is measured. The respective process is illustrated as process 201 in the process flow 200 as shown in FIG. 33. The measurement may be performed through Moire measurement, during which a tool is used to measure the package component. The measurement provides the warpage profile of package component 20, such as which parts have warpage, and the degree of the warpage. For example, FIG. 1A illustrates an example warpage profile of a package component 10 assuming package component 20 has the same structure as package component 10.

Based on the warpage profile, the parts of package component 20 to be implanted is determined. The respective process is illustrated as process 202 in the process flow 200 as shown in FIG. 33. For example, in FIG. 1A, the parts 110 have the highest warpage values, and the warpage is crying profile. In accordance with some embodiments, regions 110 of package component 10 (which is package component 20) are to be implanted. In accordance with some embodiment, in the Y-direction line 106, the warpage profile is smiling profile, and the warpage is less severe. Accordingly, no implantation is performed on the related regions, or alternatively, the implantation is performed on some of the regions with severe warpages.

Referring back to FIG. 4, implantation mask 40 is formed and is patterned. In accordance with some embodiments, implantation mask 40 comprises a patterned photoresist. In accordance with alternative embodiments, the implantation mask 40 is a tri-layer mask comprising a bottom layer, a middle layer over the bottom layer, and a top layer (a photoresist) over the middle layer. In accordance with yet other embodiments, the implantation mask 40 comprises a hard mask formed of a material different from the material of passivation layer 32, and is patterned with the help of a photoresist. For example, the implantation mask 40 may comprise titanium nitride, boron nitride, or the like.

The material of the implantation mask 40 is selected so that when it is removed in a subsequent process, passivation layer 32 is not damaged. The remaining portions of the patterned implantation mask 40 covers the portions of passivation layer 32 that are not to be implanted, while leaving the portions to be implanted open.

Further referring to FIG. 4, an (ion) implantation process 38 is performed. The respective process is illustrated as process 204 in the process flow 200 as shown in FIG. 33. In accordance with some embodiments, the implanted ions (also referred to as stress modulation dopant hereinafter) may include Ge, B, P, As, Ga, or the like, or combinations thereof. The implanted ions may also include H, Y, Zr, Xe, In, Sb, Si, N, O, C, F, Ne, He, Ar, Kr, Cl, S, Se, Sn, Al, In, Er, Yb, or a combination thereof, and/or the combination with Ge, B, P, As, and/or Ga. The concentration of the stress modulation dopant in the passivation layer may be greater than about 1E14/cm$^3$, and may be in the range between about 1E14/cm$^3$ and about 1E16/cm$^3$ in accordance with some embodiments.

In accordance with alternative embodiments, implantation mask 40 is not formed, and implantation process 38 is also not performed. Accordingly, implantation mask 40 and implantation process 38 are illustrated as being dashed to indicate that these features/processes may not be adopted. Also, processes 202 and 204 are also shown as being dashed to indicate that these processes may be performed or may be skipped.

In accordance with some embodiments, the implantation process 38 is controlled, so that the peak concentration of the implanted stress modulation dopant is inside passivation layer 32. Throughout the description, the regions implanted with the stress modulation dopant are denoted as using letter "I" (to represent "Implanted"), and the implanted regions of passivation layer 32 are denoted portions 32-I. The regions not implanted with the stress modulation dopant are denoted using symbol "UI" (to represent "Un-Implanted") and hence the un-implanted portions of passivation layer 32 are denoted as portions 32-UI. In accordance with some embodiments in which implantation process 38 is performed, dielectric layer 32 may have a thickness greater than about 1,000 Å, so that the effect of reducing warpage is significant enough.

In accordance with some embodiments, all top conductive features 34A are covered by the patterned implantation mask 40, and no top conductive features 34A are implanted. In accordance with some embodiments, the lateral distance S1 between the top conductive features 34A that is closest to the implanted region is greater than 0 μm, and may be greater than about 0.5 μm to allow for adequate process margin. Each of the top conductive features 34A thus may be encircled by an un-implanted portion of the passivation layer.

Through the implantation process 38, the material of passivation layer 32 is modified. Furthermore, the density of the implanted portions is increased. The warpage of package component 20 is thus reduced, and the warpage profile is also modified. For example, implantation process 38 and/or the subsequently formed stress modulation layers individually or collectively may result in a warpage profile to be modified from the profile shown in FIG. 1A to the profile as shown in FIG. 2A, in which the warpage profile in the X-direction is closer to the warpage profile in the Y-direction. After the implantation, the warpage contour lines may be close to be round. Also, the warpage may be changed to smiling profile in both of the X-direction and the Y-direction, as shown in FIG. 2B. In an example, the maximum warpage value WP2 in FIG. 2B is smaller than the maximum warpage value WP1 in FIG. 1A.

Figure 5:
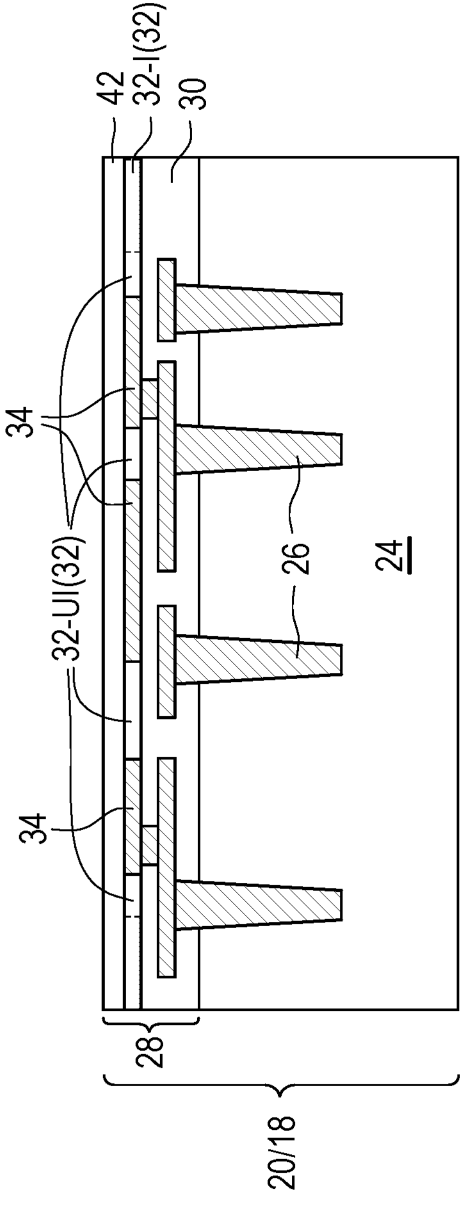

FIG. 5 illustrates the formation of dielectric layer 42. The respective process is illustrated as process 206 in the process flow 200 as shown in FIG. 33. In accordance with some embodiments, dielectric layer 42 comprises a material similar to the material of passivation layer 32, which may comprise silicon and another element(s) including oxygen, nitrogen, carbon, and/or the like. In accordance with alternative embodiments, dielectric layer 42 may be an etch stop layer, which may be formed of or comprise AlN, AlO, SiOC, or the like, or multi-layers thereof.

Figure 6:
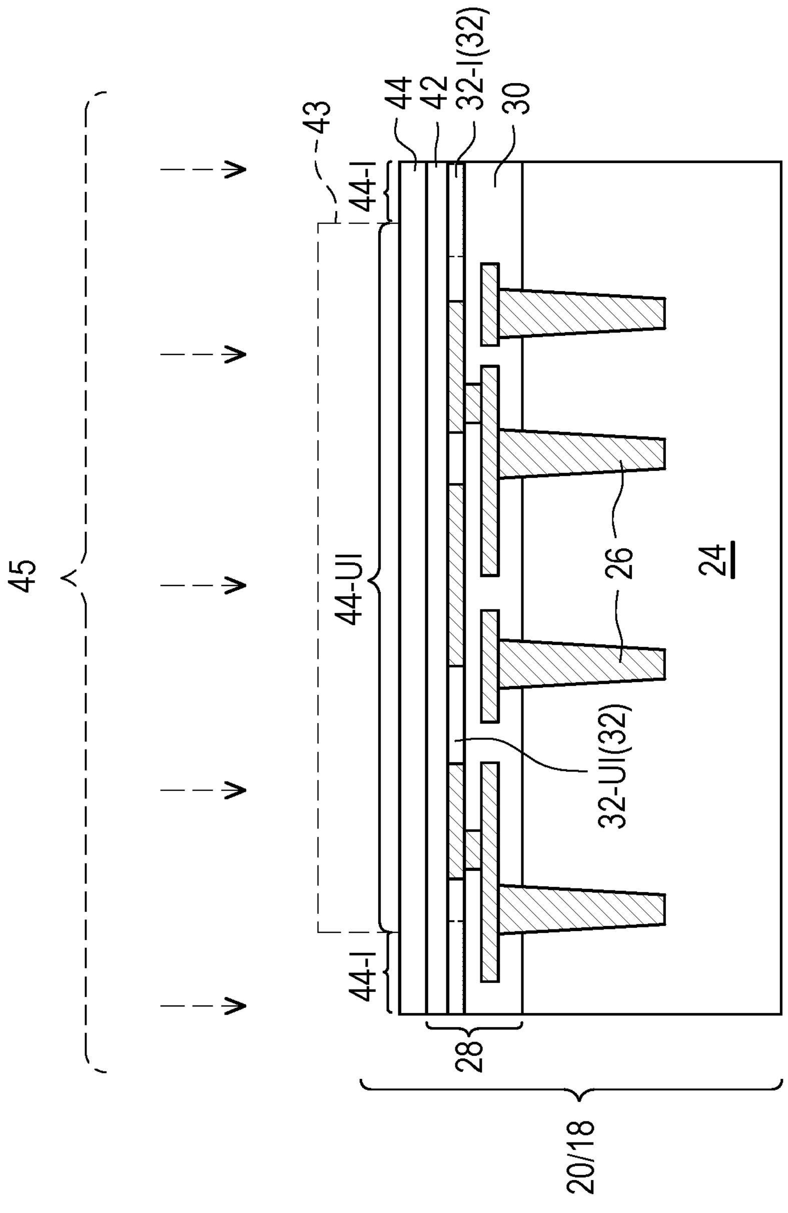

FIG. 6 illustrates the deposition of stress modulation layer 44 in accordance with some embodiments. The respective process is illustrated as process 208 in the process flow 200 as shown in FIG. 33. In accordance with some embodiments, stress modulation layer 44 may be formed of or comprise a dielectric material that comprises silicon and another element(s) including oxygen, nitrogen, carbon, and/or the like. Stress modulation layer 44 may also be expressed as $SiO_xN_yC_z$, with x being in the range between about 0 and about 2, y being in the range between about 0 and about 1.33, and z being in the range between about 0 and about 1, and x, y, and z will not be all equal to zero. For example, stress modulation layer 44 may be formed of or comprise SiON, SiN, SiOCN, SiCN, SiOC, SiC, or the like. The thickness of stress modulation layer 44 may be greater than about 1,000 Å, for example, in the range between about 1,000 Å and about 2,000 Å.

Next, implantation process 45 is performed. The respective process is illustrated as process 210 in the process flow 200 as shown in FIG. 33. The implanted ion (stress modulation dopant) may be selected from the same group of candidate elements for implantation process 38, and may be the same as, or different from, the implanted elements used in implantation process 38. Also, the peak concentration of the implanted ions is inside stress modulation layer 44. The concentration of the implanted stress modulation dopant may be in the same range as the implanted stress modulation dopant introduced by implantation process 38.

In accordance with some embodiments, the implantation process 45 is a blanket implantation process, in which no implantation mask is used, and the entire modulation layer 44 (throughout the wafer or die) is implanted. In accordance with alternative embodiments, the implantation process 45 is selective, with implantation mask 43 being formed to mask some portions of stress modulation layer 44, while leaving other portions open to the implantation. The implanted portions of stress modulation layer 44 are denoted as portions 44-I, and the un-implanted portions of stress modulation layer 44 are denoted as portions 44-UI hereinafter.

In accordance with alternative embodiments in which stress modulation regions 32-I are formed, stress modulation layer 44 may be, or may not be, formed. The processes 208 and 210 in FIG. 33 are thus also shown as being dashed.

In accordance with some embodiments, the locations for the selective implantation process 45 is determined by measuring package component 20 (or another sample package component), which measurement is performed on the structure shown in FIG. 3. The corresponding determination is essentially the same as the determination of the locations for implantation process 38. In accordance with alternative embodiments, the locations for the selective implantation is determined by measuring package component 20, which measurement is performed on the structure shown in FIG. 4 (with stress modulation regions 32-I already formed). Alternatively stated, the implantation process 45 may be performed to further reduce the warpage of the package component that has already been modulated by implantation process 38.

Figures 24A, 24B, 25A, 25B:
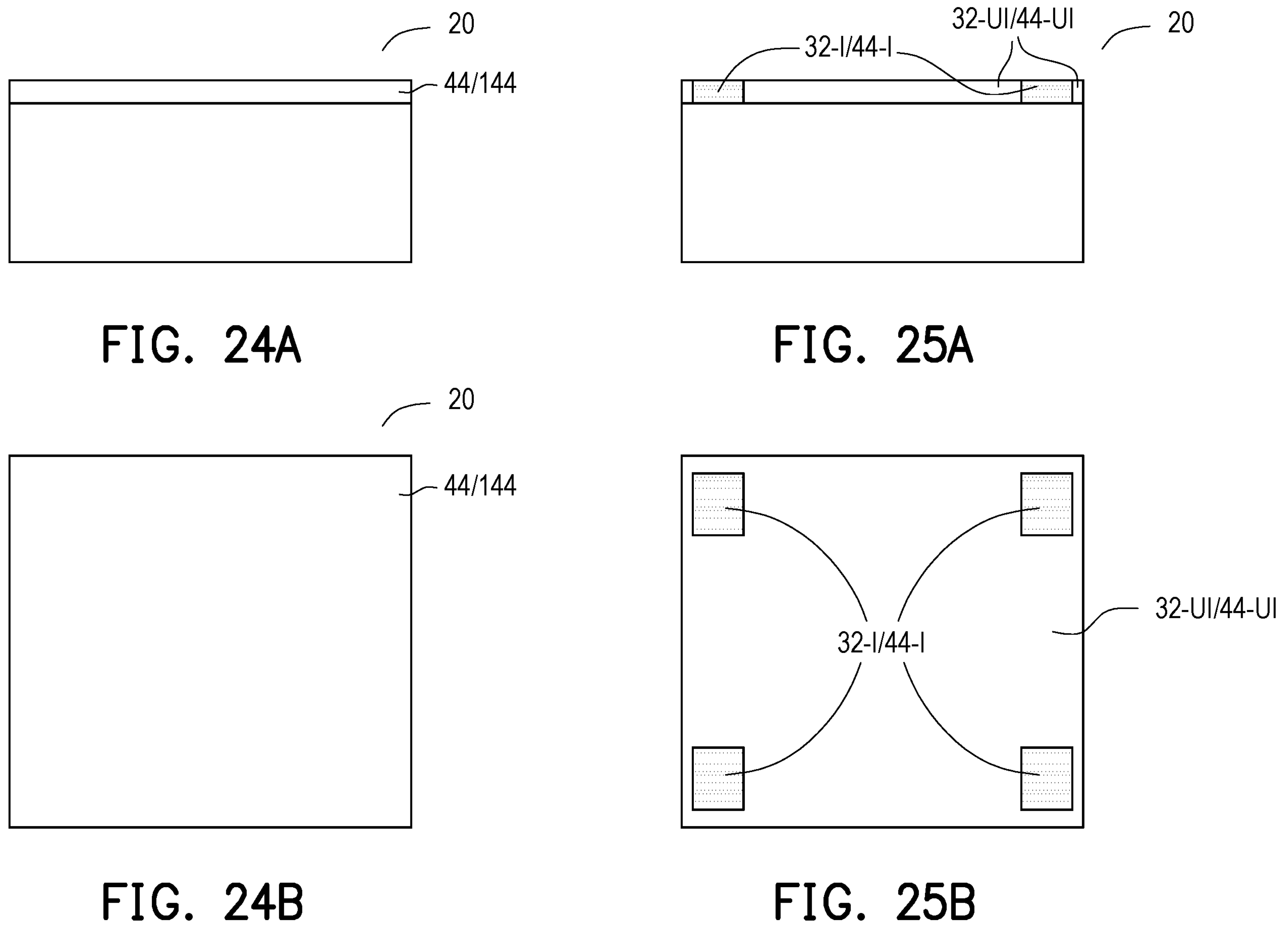
FIGS. 24A, 24B, 25A, 25B, 26A, 26B, 27A, and 27B illustrate the top views and the cross-sectional views of stress modulation layers/regions in dies in accordance with some embodiments.

FIGS. 24A, 24B, 25A, 25B, 26A, 26B, 27A, and 27B illustrate the top views and the cross-sectional views of stress modulation layers/regions in device dies in accordance with some embodiments. The features neighboring the illustrated stress modulation layers/regions are not illustrated, while these features may be found referring to the precedingly discussed cross-sectional views. FIGS. 24A and 24B illustrate a cross-sectional view and a top view, respectively, of a blanket stress modulation layer 44, which is not patterned, and may expand throughout (in the top view) the entire package component 20, which may be a die.

FIGS. 25A and 25B illustrate a cross-sectional view and a top view, respectively, of the stress modulation regions 44-I and/or 32-I, and the undoped regions 44-UI and/or 32-UI in accordance with some embodiments. Stress modulation regions 44-I and/or 32-I may be formed where the stress is high, for example, in the corner regions of the package component 20 as shown in FIG. 25B. Stress modulation regions 44-I and/or 32-I may also be formed in other locations where stress is not high, but the formation of stress modulation regions 44-I and/or 32-I in these regions may also modify the overall warpage profile of the package component 20.

Figures 26A, 26B, 27A, 27B:
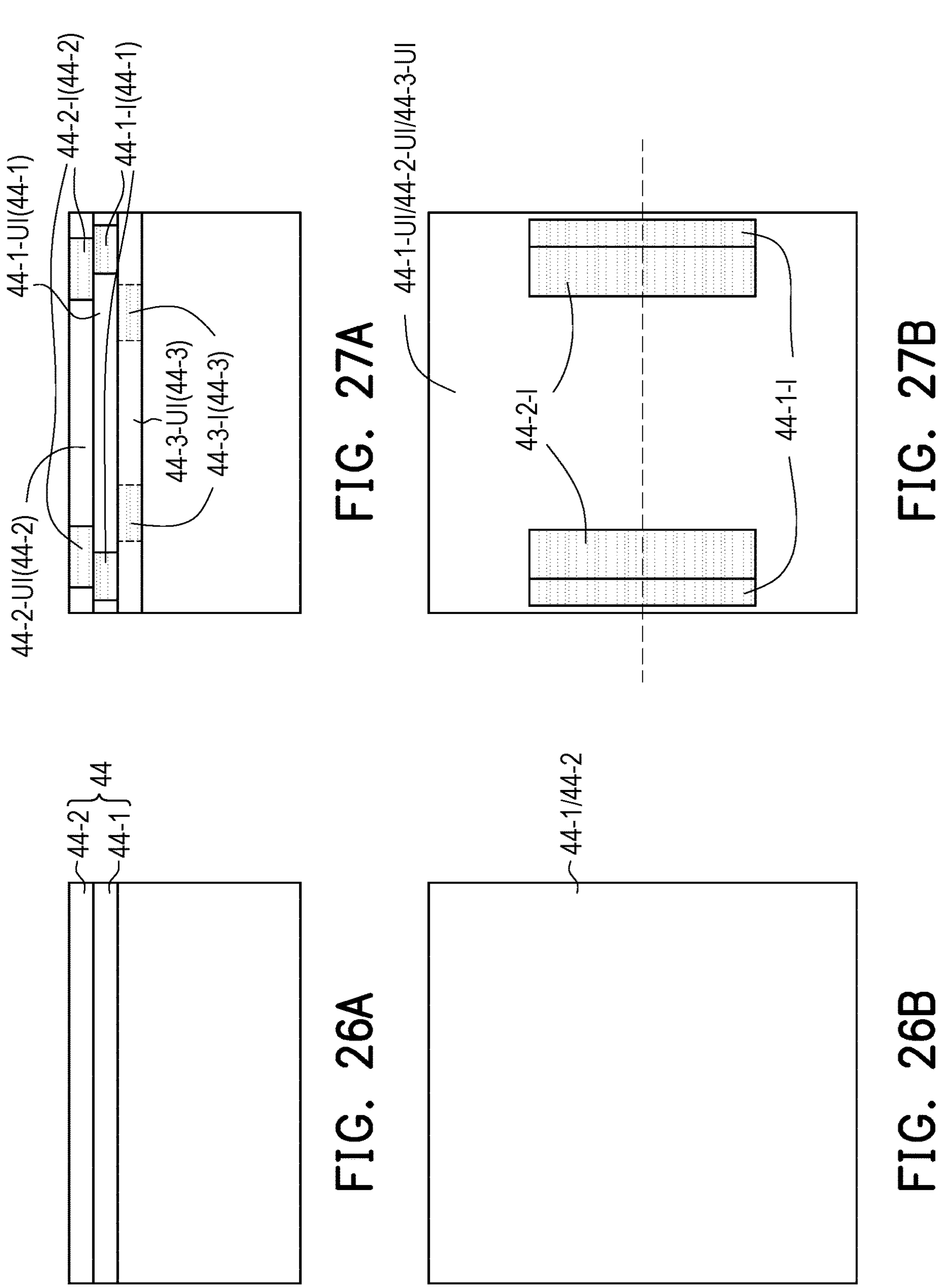

FIGS. 26A and 26B illustrate a cross-sectional view and a top view, respectively, of a blanket multi-layer stress modulation layer 44. In accordance with some embodiments, multi-layer stress modulation layer 44 includes a plurality of sub-layers including sub-layer 44-1 and sub-layer 44-2. The materials of sub-layer 44-1 and sub-layer 44-2 may be selected from the same group of candidate materials for forming the precedingly discussed stress modulation layer 44, which candidate materials may include silicon-containing dielectric materials. The materials of sub-layer 44-1 and sub-layer 44-2 may be the same as each other or different from each other. The stress modulation dopant of sub-layer 44-1 and sub-layer 44-2 may be selected from the same group of candidate stress modulation dopants for forming stress modulation layer 44 and stress modulation regions 32-I, and may be the same as each other or different from each other.

In accordance with some embodiments, the formation of multi-layer stress modulation layer 44 may include depositing sub-layer 44-1, performing a first implantation process to implant sub-layer 44-1. The peak concentration PC44-1 of the respective stress modulation dopant introduced by the first implantation process is inside sub-layer 44-1. Sub-layer 44-2 is then deposited on sub-layer 44-1, followed by a second implantation process to implant sub-layer 44-2. The peak concentration PC44-2 of the respective stress modulation dopant introduced by the second implantation process is inside sub-layer 44-2. In accordance with some embodiments, the peak concentration PC44-2 is higher than or lower than the peak concentration PC44-1, and the peak concentration ratio PC44-2/PC44-1 being greater than about 5 or 10, or lower than about 0.2 and 0.1, for example.

FIGS. 27A and 27B illustrate a cross-sectional view and a top view, respectively, of the multi-layer stress modulation layer 44 in accordance with alternative embodiments. These embodiments are essentially the same as the embodiments shown in FIGS. 26A and 26B, except that instead of blank deposition, selective deposition processes are performed to form stress modulation regions 44-1-I and 44-2-I. Again, modulation regions 44-1-I and 44-2-I are formed in separate implantation processes, with the peak concentrations being in the respective sub-layers 44-1 and 44-2, respectively. The peak concentration ratio PC44-2/PC44-1 may also be in the similar range as discussed above.

As shown in FIGS. 27A and 27B, stress modulation regions 44-2-I may partially overlap the respective underlying stress modulation regions 44-1-I. Some or all stress modulation regions 44-2-I may also fully offset from stress modulation regions 44-1-I. There may also be stress modulation regions 44-3-I underlying stress modulation regions 44-1-I. Stress modulation regions 44-3-I may also be formed by a third implantation process. The peak concentration PC44-3 of the stress modulation dopant introduced by the third implantation process is in sub-layer 44-3. The peak concentration PC44-3 may be higher than, equal to, or lower than each of the peak concentrations PC44-1 and PC44-2.

Figure 7:
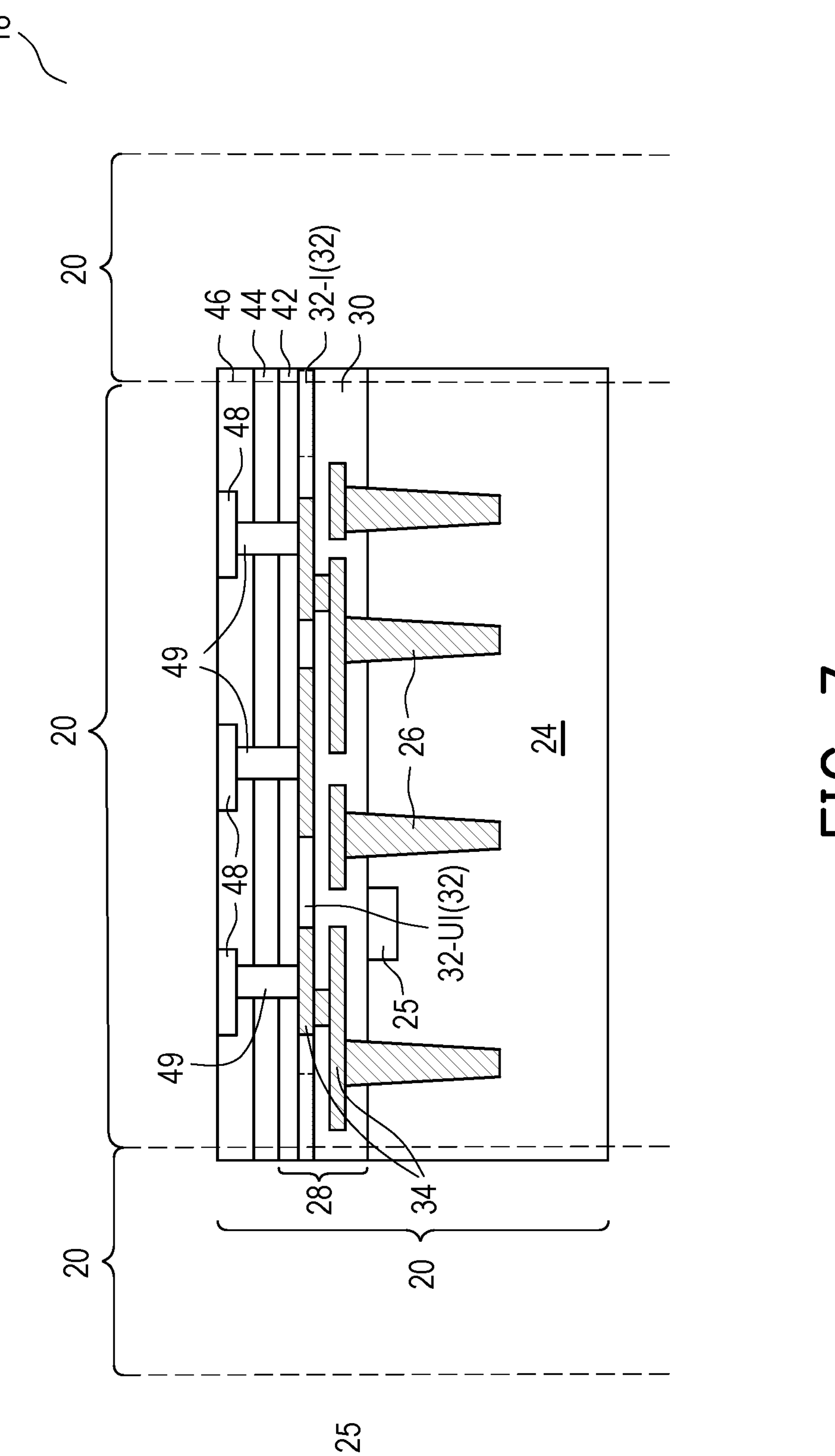

Referring to FIG. 7, vias 49, bond layer 46, and bond pads 48 are formed. The respective process is illustrated as process 212 in the process flow 200 as shown in FIG. 33. Vias 49 may penetrate through stress modulation layer 44. Bond layer 46 may be formed of a silicon-containing dielectric material, which silicon-containing dielectric material may be selected from the same group of candidate materials for forming stress modulation layer 44. Bond pads 48 may comprise copper, and may be formed through a damascene process. In accordance with alternative embodiments, solder regions are formed as the top surface features of package component 20.

In accordance with some embodiments, the preceding processes as shown in FIGS. 3 through 7 are performed at wafer level, and package component 20 is a part of wafer 18. Next, as shown in FIG. 7, wafer 18 is diced in a singulation process, which may be performed using a sawing blade. Wafer 18 is thus separated into discrete package components 20. The respective process is illustrated as process 214 in the process flow 200 as shown in FIG. 33.

Figure 8:
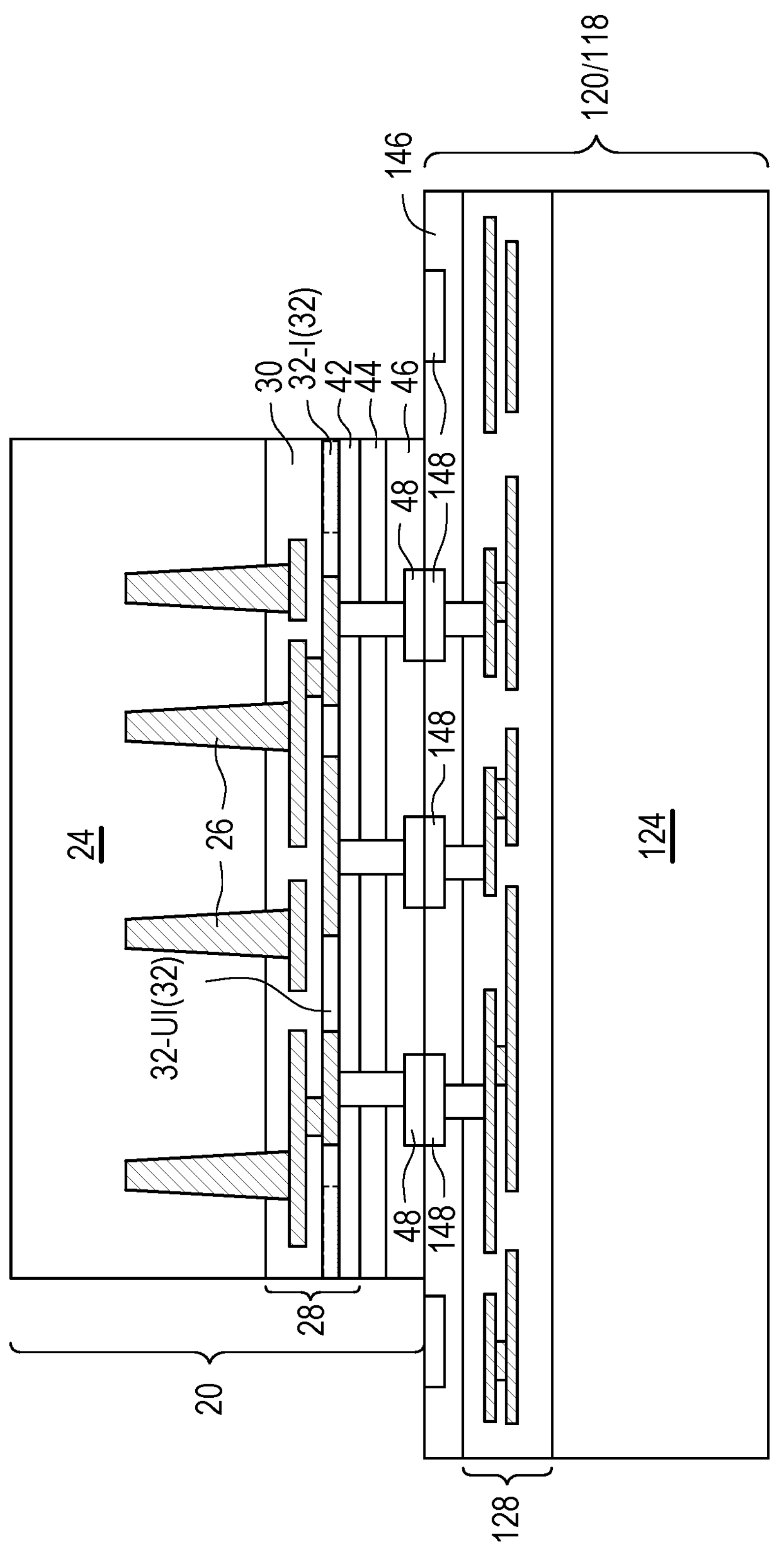

Referring to FIG. 8, package component 118 is formed. In accordance with some embodiments, package component 118 is a device wafer (a functional wafer), an interposer wafer, a reconstructed wafer including packaged device dies therein, a package substrate strip, or the like. Package component 120 may accordingly be a device die, an interposer die, a package, a package substrate, or the like.

In some embodiments, package component 120 has a similar structure as that of package component 20. The structures and the materials of the features in package component 120 may be found referring to the like features in package component 20, with the like features in package component 120 being denoted by adding number "1" in front of the reference numbers of the corresponding features in package component 20. For example, the substrate in package component 20 is denoted as 24, and accordingly, the substrate in package component 120 is denoted as 124.

Package component 120 may include integrated circuit devices (not shown), interconnect structure 128, bond pads 148, and bond layer 146. The details of these features may be similar to the corresponding features in package component 20, and are not repeated herein. Package component 120 may or may not include stress modulation regions and stress modulation layers. The stress modulation regions and stress modulation layers, when formed, may be essentially the same as in package component 20. Some example stress modulation regions and stress modulation layers in package component 120 may be found in FIG. 17 as an example.

Package component 20 is bonded to package component 120. The respective process is illustrated as process 216 in the process flow 200 as shown in FIG. 33. In the illustrated example, a hybrid bonding process is performed, so that bond pads 48 are bonded to bond pads 148 through metal-to-metal bonding, and bond layer 46 is bonded to bond layer 146 through fusion bonding (with Si—O—Si bonds being formed). In accordance with alternative embodiments, other types of bonding such as direct metal-to-metal bonding, solder bonding, or the like may be performed. While one package component 20 is illustrated, a plurality of package components 20 (such as dies) may be bonded to the respective package components 120 in package component 118.

Figure 9:
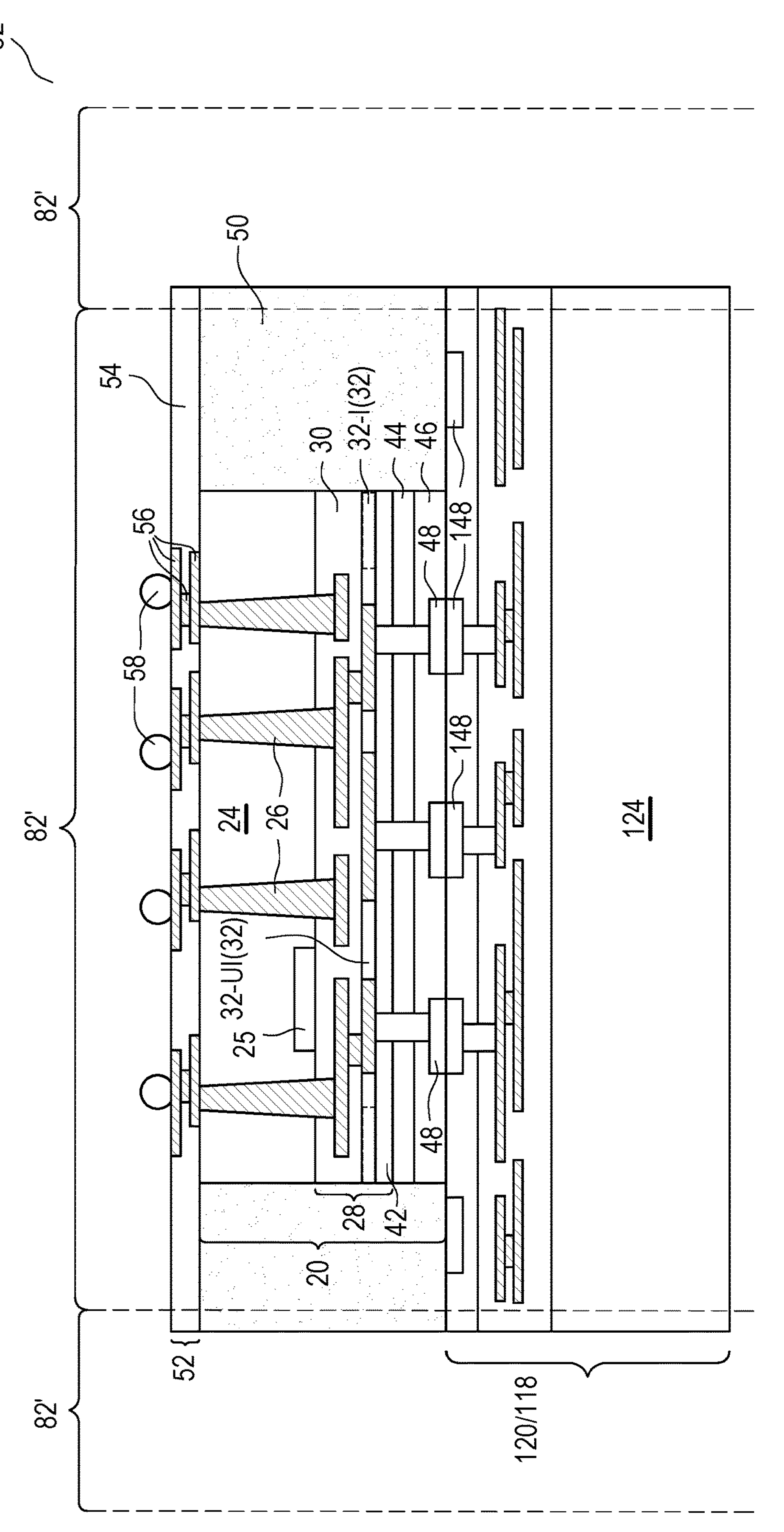

FIG. 9 illustrates the gap-filling process to fill the gaps between package components 20 with gap-fill regions 50. The respective process is illustrated as process 218 in the process flow 200 as shown in FIG. 33. The gap-fill regions 50 may be formed of inorganic dielectric materials such as a silicon nitride liner and a silicon oxide region on the silicon nitride liner. Alternatively, gap-fill regions 50 may be formed of a molding compound.

FIG. 9 further illustrates the formation of backside interconnect structure 52 on the backside of package component 20. In accordance with some embodiments, the gap-fill regions 50 and the substrate 24 of package component 20 are planarized, for example, in a Chemical Mechanical Polish (CMP) process or a mechanical polish process, until through-vias 26 are exposed. The respective process is illustrated as process 220 in the process flow 200 as shown in FIG. 33.

Next, backside interconnect structure 52 including dielectric layers 54 and redistribution lines (RDLs) 56 are formed. The respective process is illustrated as process 222 in the process flow 200 as shown in FIG. 33. Electrical connectors 58 (such as solder regions) are then formed, hence forming reconstructed wafer 82. Subsequently, a singulation process may be performed to separate reconstructed wafer 82 into discrete packages 82', which are identical. The respective process is illustrated as process 224 in the process flow 200 as shown in FIG. 33.

The preceding embodiments illustrate a face-to-face bonding process. FIGS. 10-13 illustrate the cross-sectional views of intermediate stages in the formation of a package formed through a face-to-back bonding process in accordance with alternative embodiments of the present disclosure. Unless specified otherwise, the materials, the structures, and the formation processes of the components in these embodiments are essentially the same as the like components denoted by like reference numerals in the preceding embodiments. The details regarding the materials, the structures, and the formation processes provided in each of the embodiments throughout the description may be applied to any other embodiment whenever applicable. Furthermore, whenever a package component throughout the description is referred to as comprising stress modulation layers/regions, the discussion of the formation processes of stress modulation layers/regions 32-I and 44 also apply.

Figure 10:
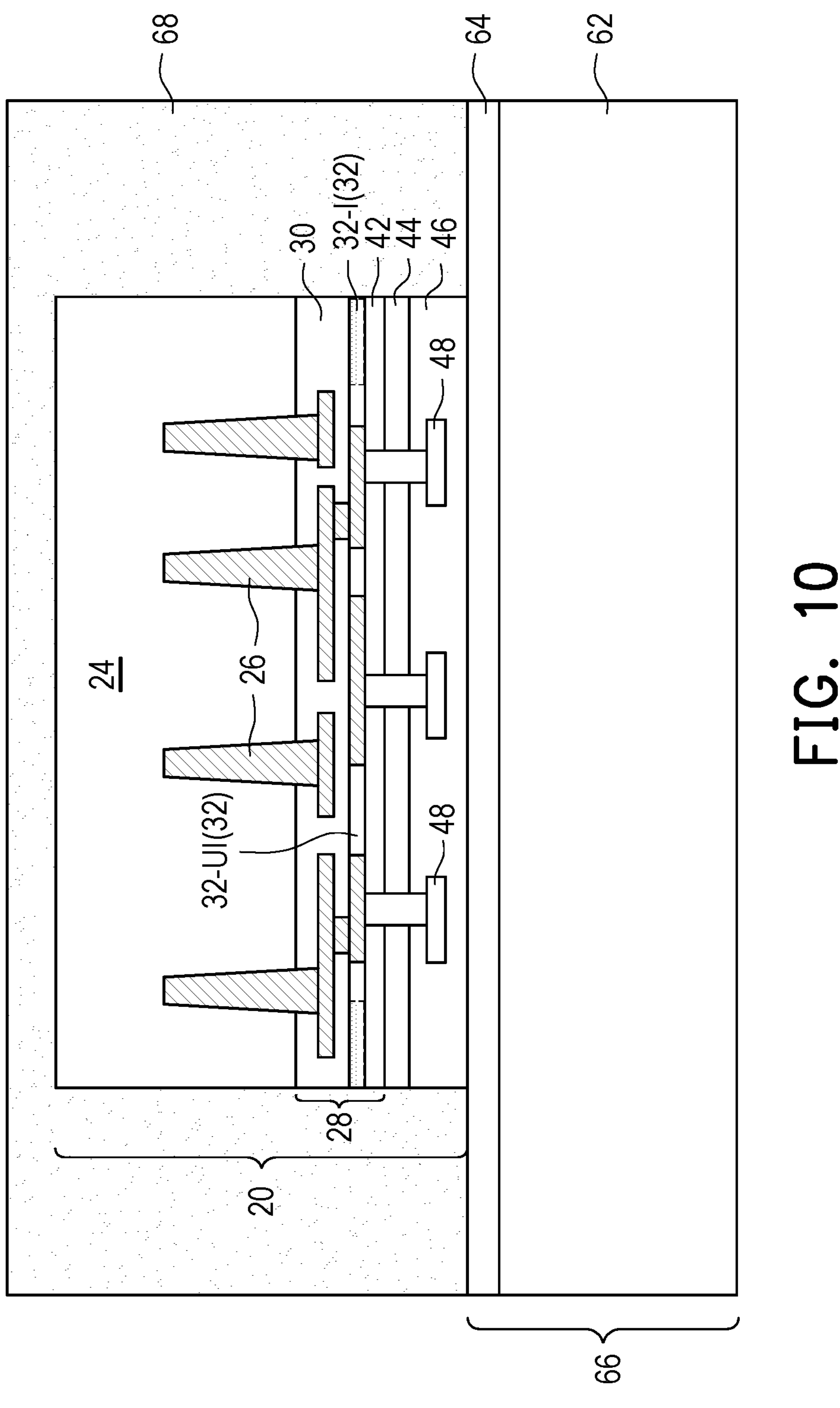
FIGS. 10-13 illustrate the cross-sectional views of intermediate stages in the formation of a package through face-to-back bonding in accordance with some embodiments.

The initial steps of these embodiments are essentially the same as shown in FIGS. 1 through 7, in which package components 20 are formed. Next, FIG. 10 illustrates the bonding/attaching of package components 20 to carrier 66. Carrier 66 includes semiconductor substrate 62, which may be a silicon substrate in accordance with some embodiments. Bond layer 64 is formed on semiconductor substrate 62. Bond layer 64 may be formed through a deposition process or a thermal oxidation process, and may be formed of a silicon-containing dielectric material, which may be selected from the same group of candidate materials of bond layer 46 (FIG. 7) in package components 20. The bonding of bond layer 64 to bond layer 46 may be through fusion bonding in accordance with some embodiments.

In accordance with alternative embodiments, carrier 66 includes a transparent substrate (also denoted using reference numeral 62) such as a glass substrate, with package components 20 being attached to carrier 66 through an adhesive such as a light-to-heat-Conversion (LTHC) material (also denoted using reference numeral 64), which is configured to be decomposed under the heat of light (such as a laser beam). In accordance with these embodiments, the layer 46 in package component 20 may be a polymer layer such as a polyimide layer, a Benzocyclobutene (BCB) layer, or the like.

Gap-filling regions 68 are then formed to fill the gaps between package components 20. Gap-filling regions 68 may be formed of inorganic dielectric materials, for example, including a silicon nitride liner and a silicon oxide layer over the silicon nitride liner. Alternatively, gap-filling regions 68 may be formed of molding compound.

Figure 11:
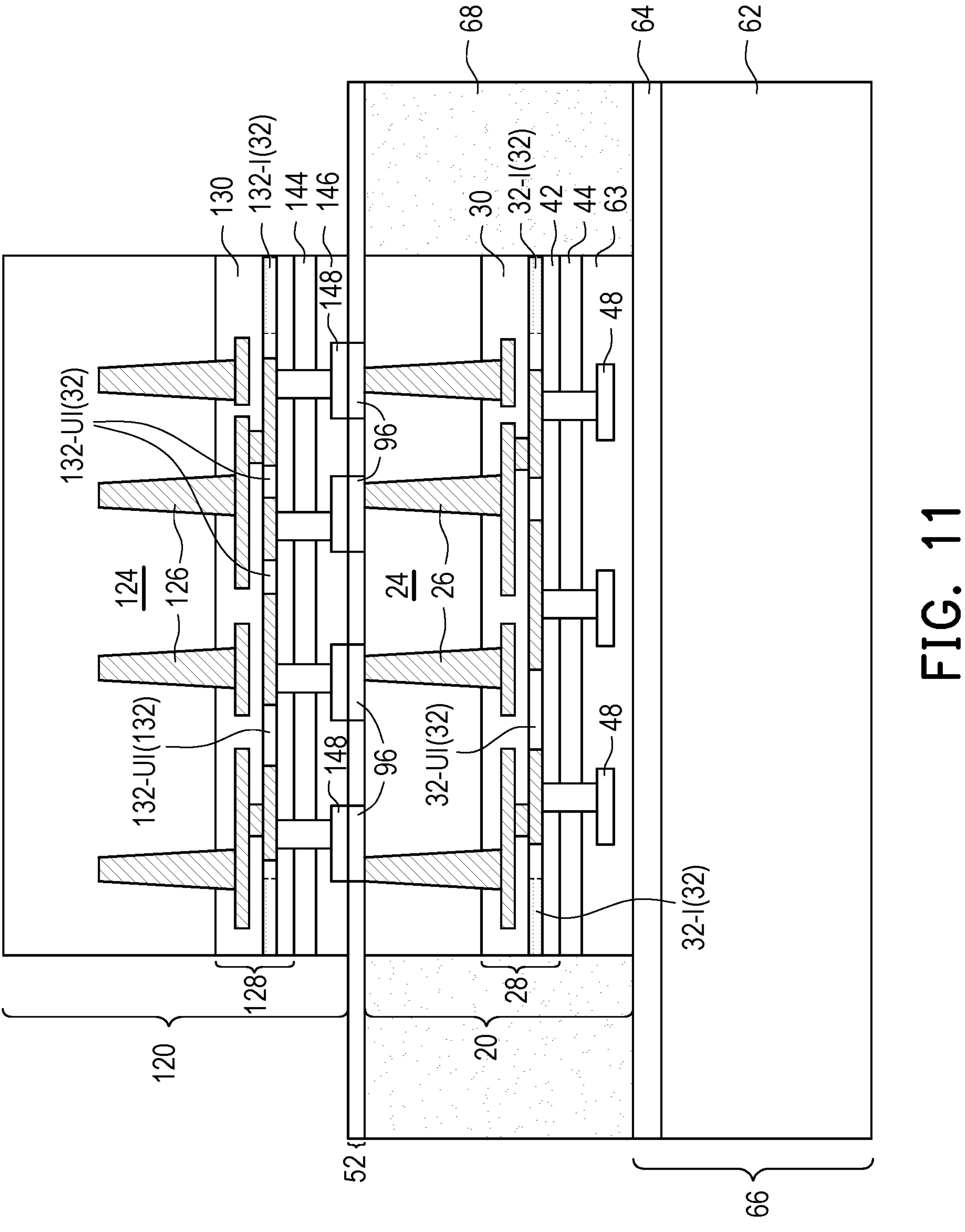

Next, referring to FIG. 11, a backside grinding process is performed on the gap-filling regions 68 and the semiconductor substrate 24 of package components 120, so that through-vias 26 are revealed. Backside interconnect structure 52 is then formed on the backside of package components 20. Backside interconnect structure 52 may include bond pads 96.

Package components 120 are bonded to package components 20. Package components 120 may be a device die, a package, an interposer, or the like. In accordance with some embodiments, package components 120 include active devices such as transistors. Furthermore, package components 120 may include stress modulation layers/regions 132-I and/or 144. The stress modulation layers/regions 132-I/144 may be formed using essentially the same methods, and having the same group of candidate structures, as the stress modulation layers/regions in package components 20. For example, stress modulation regions 132-I are formed through implantation, while portions 132-UI are not implanted. Stress modulation layer 144 may also be formed through deposition and implantation.

Figure 12:
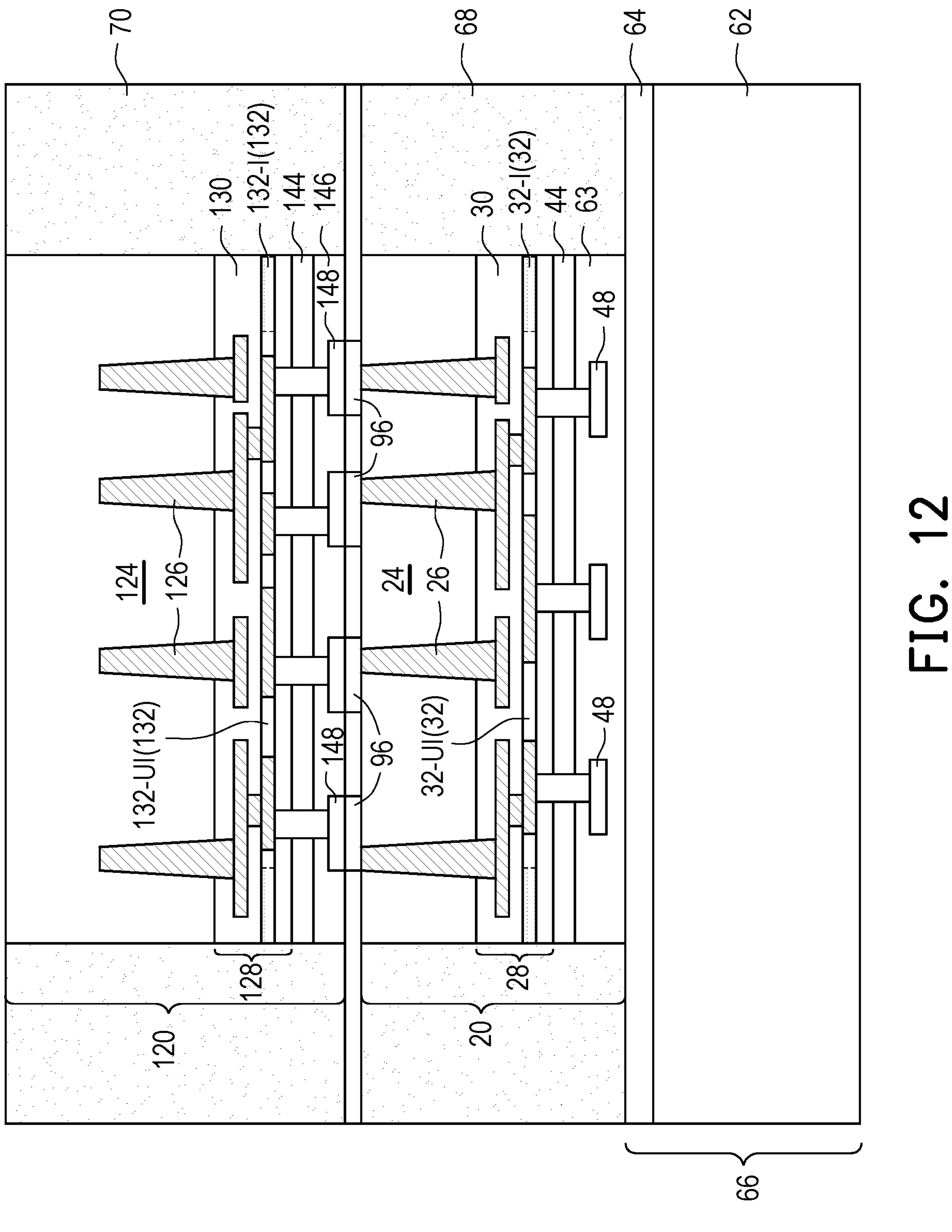

FIG. 12 illustrates the formation of gap-filling regions 70, which may be formed of inorganic dielectric materials such as a silicon nitride liner and a silicon oxide layer over the silicon nitride liner. Alternatively, gap-filling regions 70 may be formed of a molding compound. A backside grinding process is performed to level the top surfaces of package components 120 and gap-filling regions 70.

Figure 13:
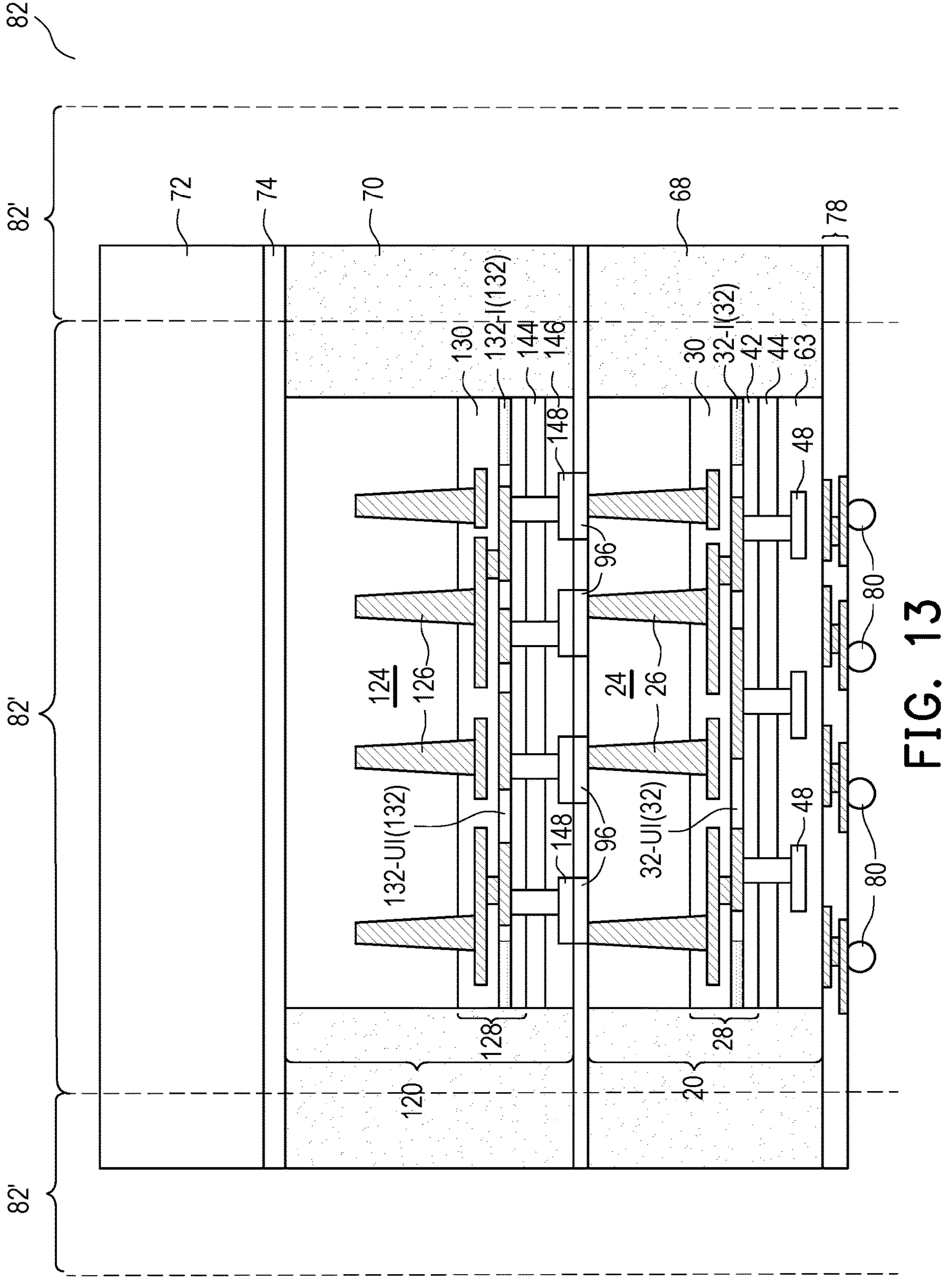

FIG. 13 illustrates the attachment/bonding of carrier 76 to package components 120 and gap-filling regions 70. Carrier 76 includes substrate 72 and bond layer 74. The structure and materials of carrier 76 may be selected from the same group of candidate structures and materials of carrier 66. The attachment/bonding may be through fusion bonding of bond layer 74 to the substrates 124 of package components 120 and the gap-filling regions 70.

The carrier 66 (FIG. 12) is then removed, and interconnect structure 78 and electrical connectors 80 (such as solder regions or metal bumps) are formed on the front side of package components 20. Reconstructed wafer 82 is thus formed. In a subsequent process, a singulation process is performed to saw reconstructed wafer 82 into a plurality of packages 82'. Packages 82' may be used for further packaging process, in which the parts of carrier 76 may be removed, and the through-vias in package components 120 may be exposed for forming further electrical connections thereon.

Figure 14:
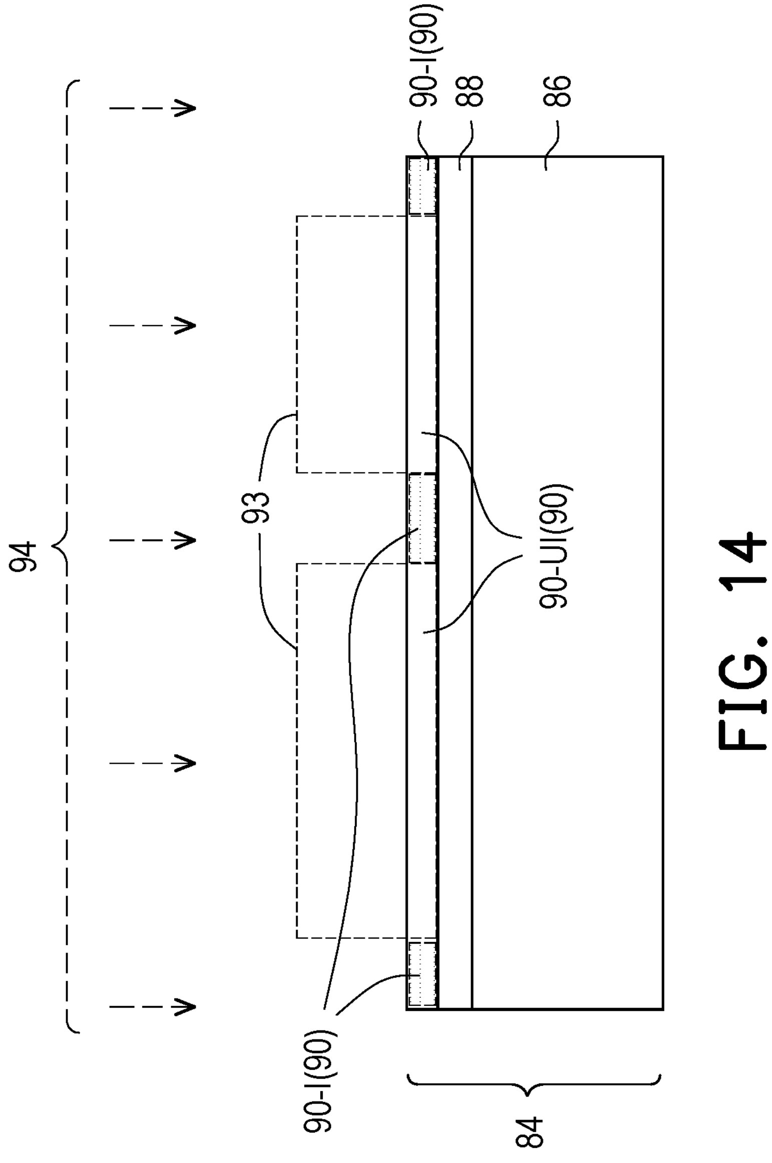
FIGS. 14-16 illustrate the cross-sectional views of intermediate stages in the formation of a package including a functional wafer bonding to a carrier wafer in accordance with some embodiments.
Figure 15:
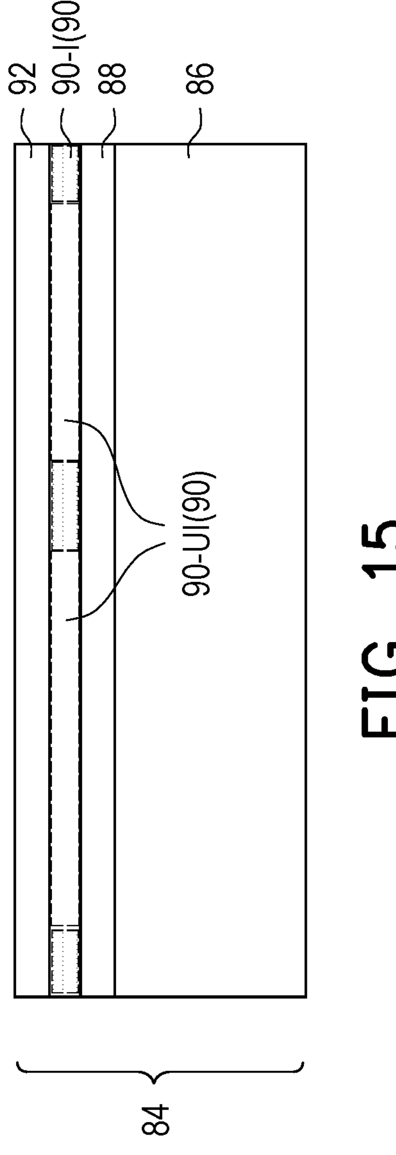
Figure 16:
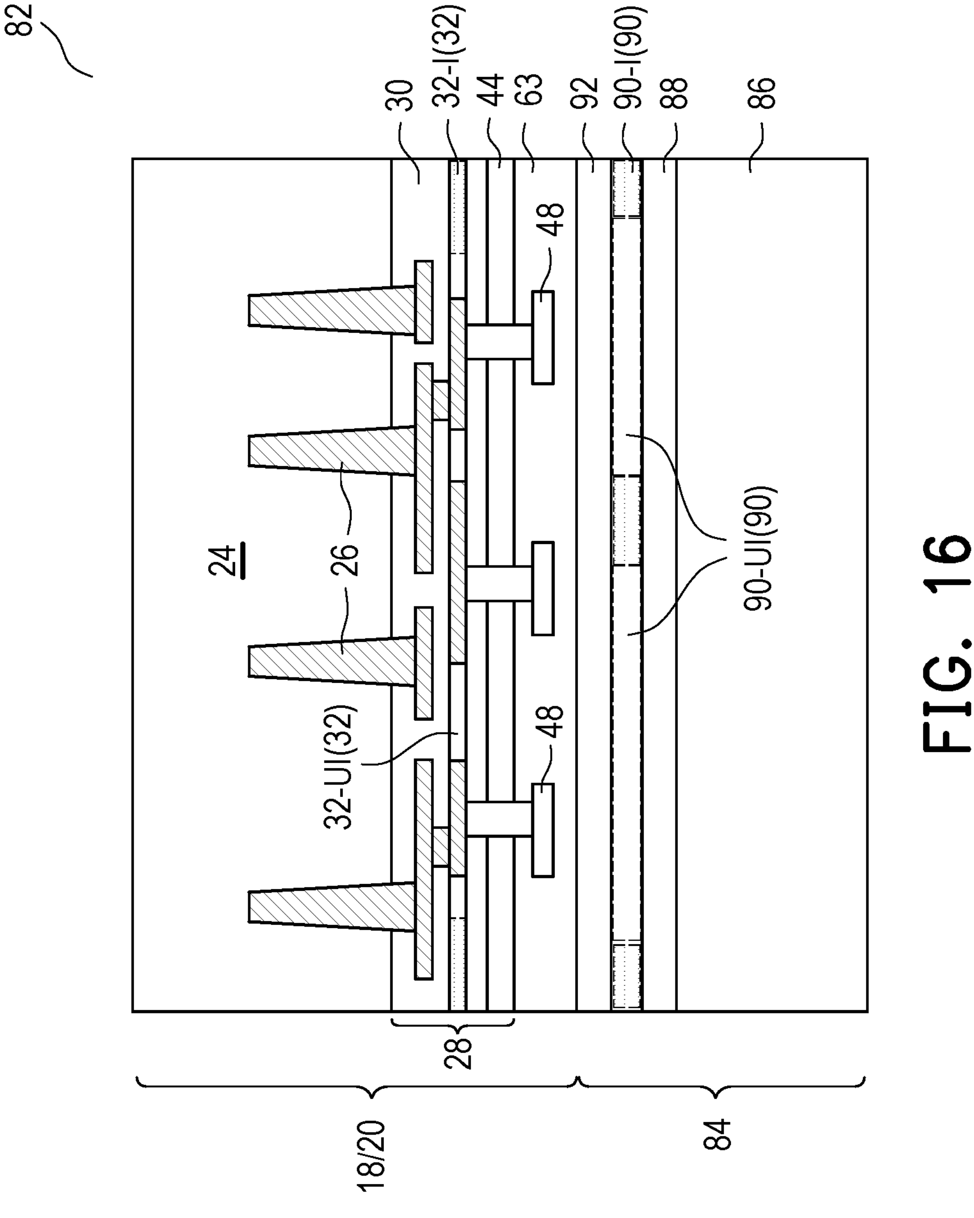

FIGS. 14-16 illustrate a wafer-on-wafer bonding process, in which a function wafer (including functional integrate circuits (active devices/circuits)) is bonded to a carrier wafer 84. In accordance with some embodiments, carrier wafer 84 includes semiconductor substrate (such as a silicon substrate) 86, dielectric layer 88, and stress modulation layer 90. Stress modulation layer 90 may be deposited, and may comprise a silicon-containing dielectric material comprising silicon and an element(s) selected from N, O, C, and combinations thereof.

In accordance with some embodiments, implantation process 94 is performed to implant a stress modulation dopant, which may be selected from the same group of candidate stress modulation dopants adopted in processes 38 (FIG. 4) and 45 (FIG. 6). The implantation process 94 may be a blanket implantation process, with no plantation mask used, and hence the entire stress modulation layer 90 throughout carrier wafer 84 is implanted. In accordance with alternative embodiments, experiments may be performed to measure carrier 84 and/or the resulting sample reconstructed wafer 82 (FIG. 16) to find warpage values and warpage profile of the entire carrier wafer 84. Based on the measured warpage profile, selected regions of stress modulation layer 90 are implanted to reduce warpage and modify warpage profile of the resulting reconstructed wafer 82. For example, implantation mask 93 may be formed, so that selected regions 90-I are implanted, and regions 90-UI are not implanted. Again, the peak dopant concentration of the implanted stress modulation dopant is inside the stress modulation layer 90.

Figures 28, 29, 30, 31:
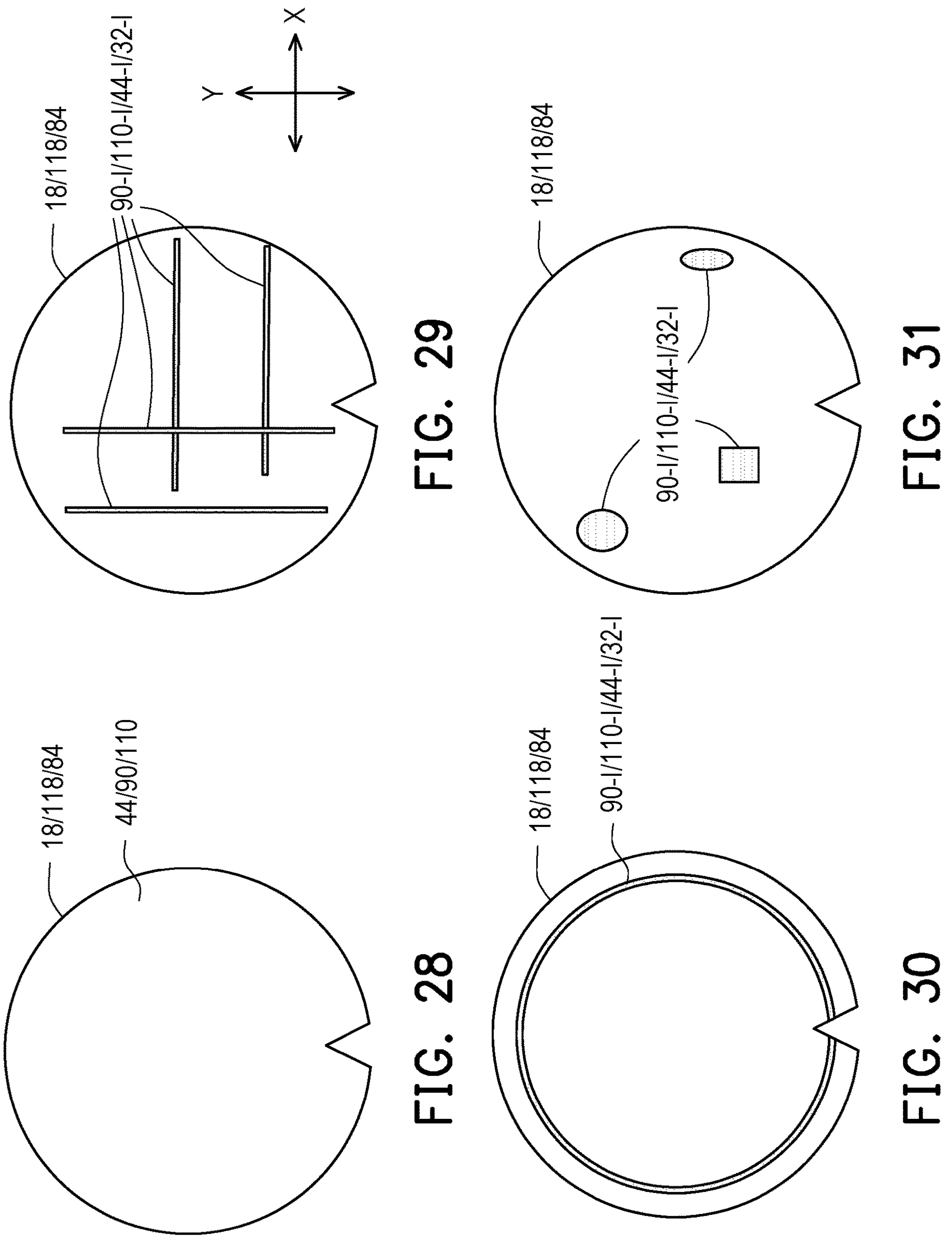
FIGS. 28-31 illustrate the patterns and positions of stress modulation layers/regions in wafers in accordance with some embodiments.

FIGS. 28-31 illustrate some wafers (which may be carrier wafer 84 and/or wafers 18 and 118 as discussed in subsequent processes, referred to as 84/18/118 hereinafter) and the implanted portions in accordance with different embodiments. As shown in FIG. 28, the entire carrier wafer 84/18/118 is implanted. In FIG. 29, some strip portions of carrier wafer 84/18/118 are implanted. The overlapped regions of the implanted strips having lengthwise directions in the X-direction and the implanted strips having lengthwise directions in the Y-direction may overlap the regions where the warpage value is highest among carrier wafer 84/18/118. FIG. 30 illustrates an embodiment in which the implanted region is a circular region, or may include a plurality of circular regions. FIG. 31 illustrates an embodiment in which selected and isolated regions are implanted.

Referring to FIG. 15, bond layer 92 is deposited on stress modulation layer 90. Bond layer 92 may also be formed of a silicon-containing dielectric material, which may include silicon and an element(s) selected from N, O, C, and combinations thereof. Next, as shown in FIG. 16, carrier wafer 84 is bonded with functional wafer 18 through fusion bonding. Functional wafer 18 may be formed using the processes shown in FIGS. 3-7.

In the structure shown in FIG. 16, in accordance with some embodiments, stress modulation layers/regions are formed in carrier wafer 84, but not in functional wafer 18. In accordance with alternative embodiments, stress modulation layers/regions are formed in functional wafer 18, but not in carrier wafer 84. In accordance with yet alternative embodiments, stress modulation layers/regions are formed in both of functional wafer 18 and carrier wafer 84.

Figure 17:
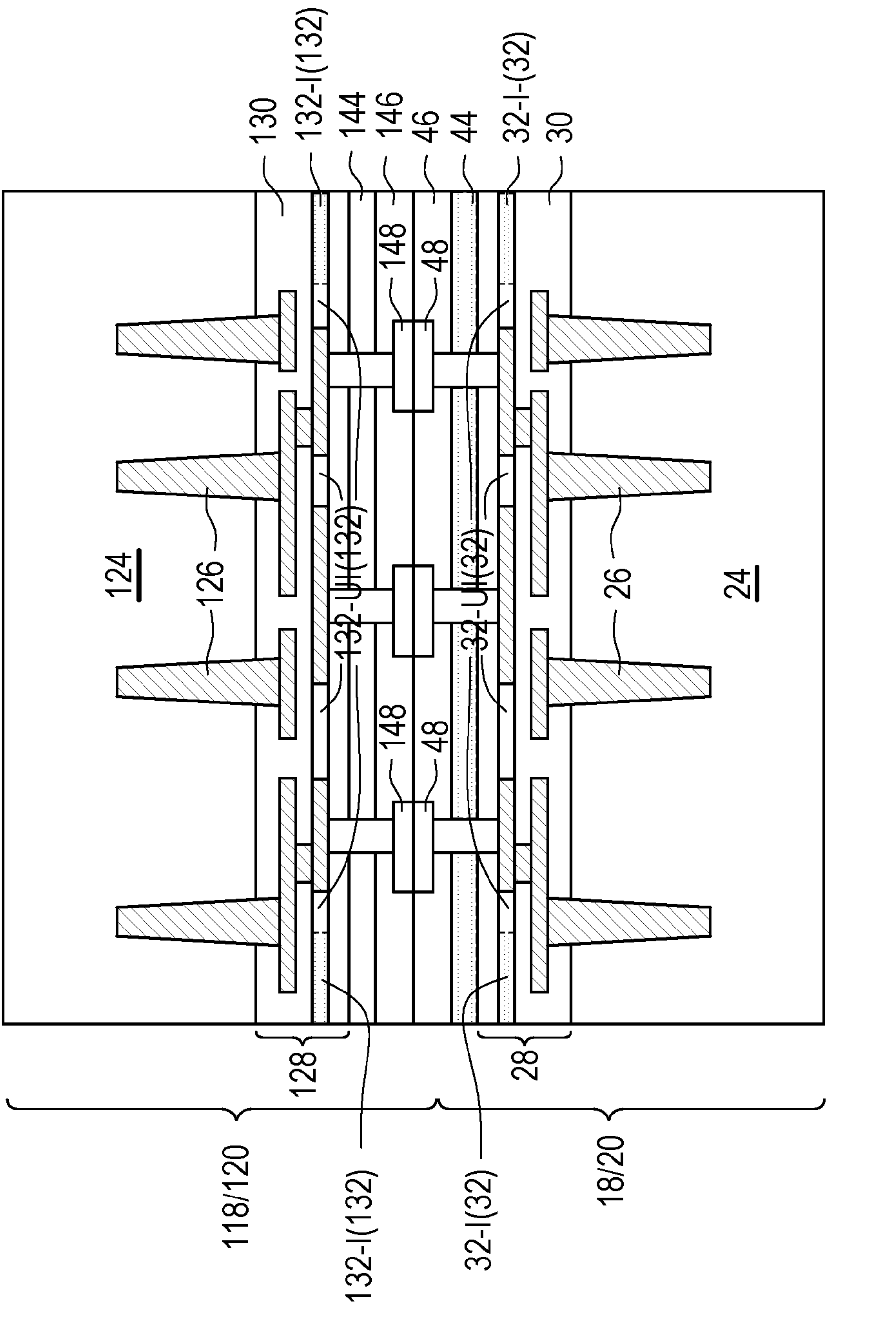
FIG. 17 illustrates the cross-sectional view of a package including two functional wafers bonding to each other in accordance with some embodiments.

FIG. 17 illustrates the formation of a package in accordance with alternative embodiments. The packaging includes the face-to-face bonding of wafers 18 and 118, which include device dies 20 and 120, respectively. The details of the device dies 20 and 120 are discussed in preceding embodiments, and thus are not repeated herein. Again, stress modulation layers/regions may be formed in either one of device dies 20 and 120 (and wafers 18 and 118), or in both of device dies 20 and 120 (and wafers 18 and 118). Also, the formation of stress modulation layers/regions may be at die level, as shown in FIGS. 24A, 24B, 25A, 25B, 26A, 26B, 27A, and 27B, or at wafer level, as shown in FIGS. 28-31.

Figure 18:
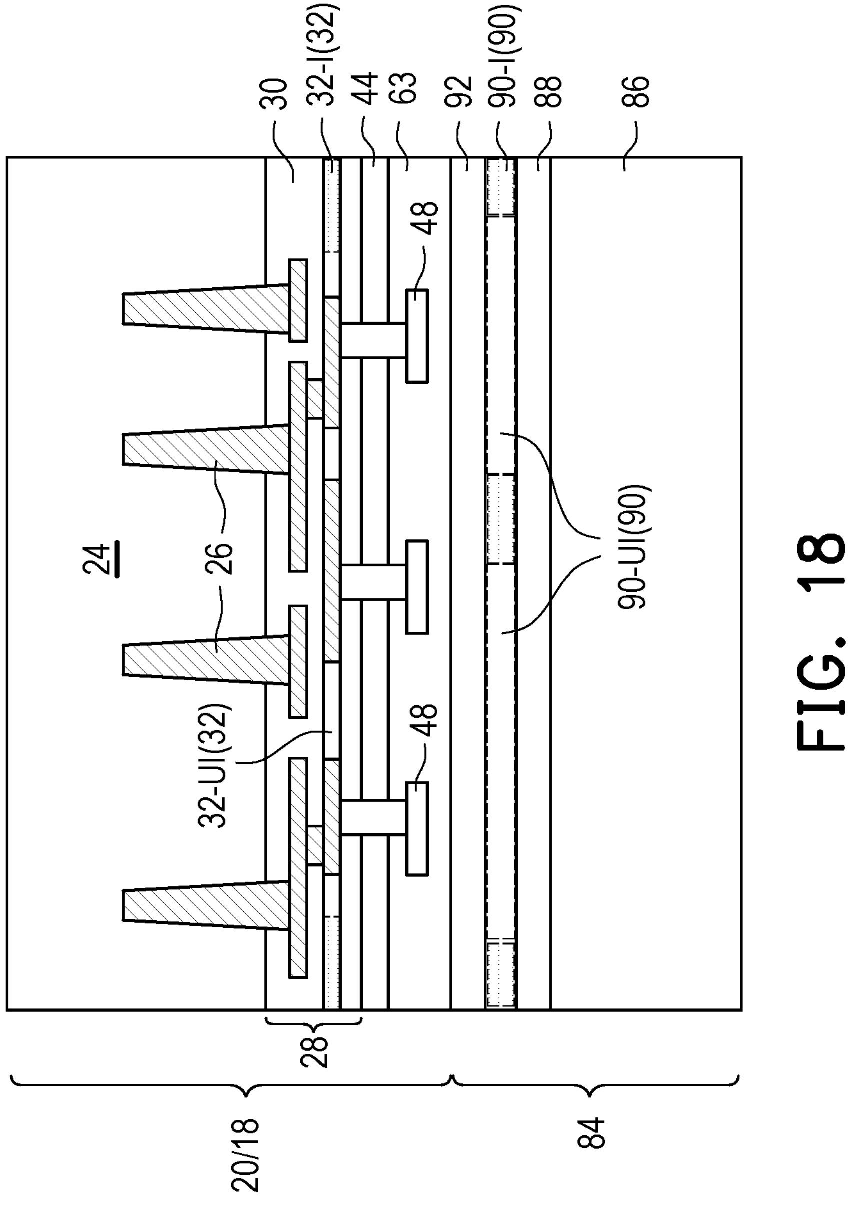
FIGS. 18-20 illustrate the cross-sectional views of intermediate stages in the formation of a package including a stress modulation layer formed on a back side of a wafer in accordance with some embodiments.
Figure 19:
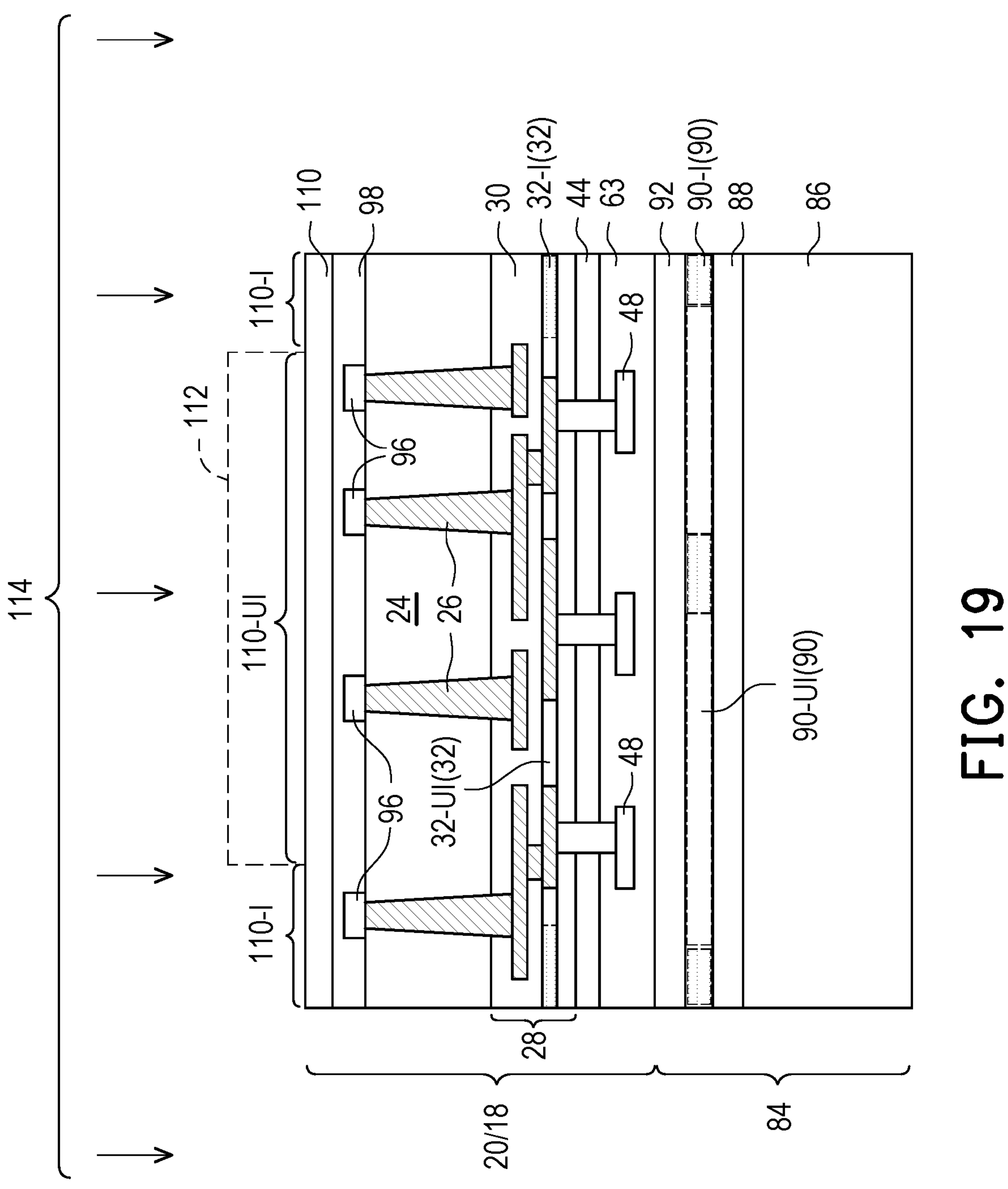
Figure 20:
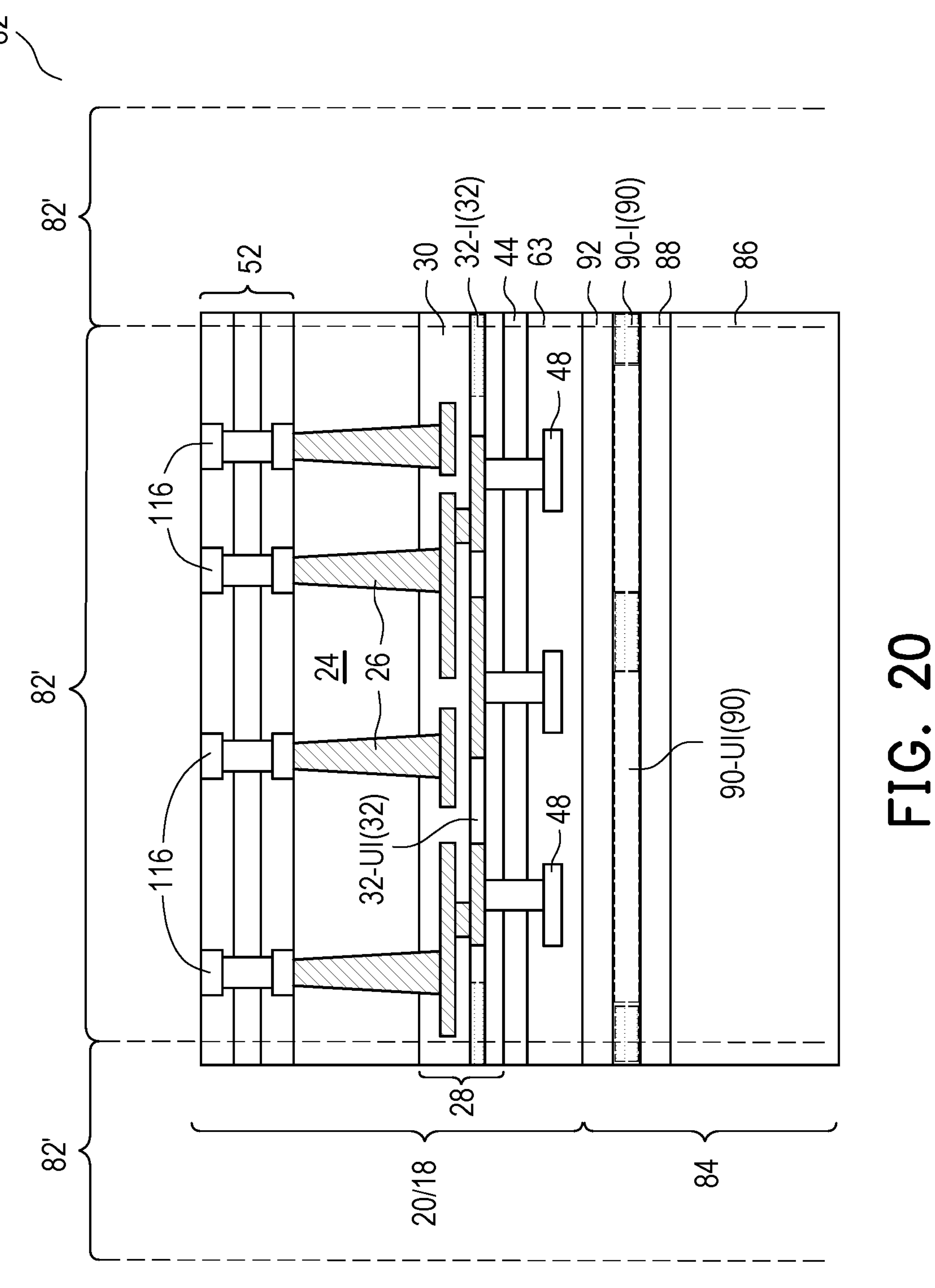

FIGS. 18-20 illustrates the formation of stress modulation layer on a backside of a functional wafer in accordance with some embodiments. Referring to FIG. 18, functional wafer 18 is bonded to carrier wafer 84. Stress modulation layers/regions may be formed in either one or both of carrier wafer 84 and the front side of functional wafer 18. The bonding may include fusion bonding in accordance with some embodiments. Next, referring to FIG. 19, the semiconductor substrate 24 of functional wafer 18 is thinned to reveal through-vias 26. Backside dielectric layers 98 are formed, and bond pads 96 are formed in backside dielectric layer 98.

Next, stress modulation layer 110 is deposited, which may be formed of a material similar to the materials of other stress modulation layers such as stress modulation layer 44. Implantation process 114 may be performed to introduce a stress modulation dopant into stress modulation layer 110, with the peak concentration of the stress modulation dopant being inside stress modulation layer 110. The implantation process 110 may be blanket, as shown in FIG. 28, or may be selective, as shown in FIGS. 29-31. Implantation mask 112 is shown in FIG. 19 to define the implanted regions in the selective implantation process.

FIG. 20 illustrates the formation of bond layer 115 and bond pads 116, which may be used for a hybrid bonding process. Reconstructed wafer 82 is thus formed. Reconstructed wafer 82 may then be singulated to form a plurality of discrete packages 82'.

Figure 21:
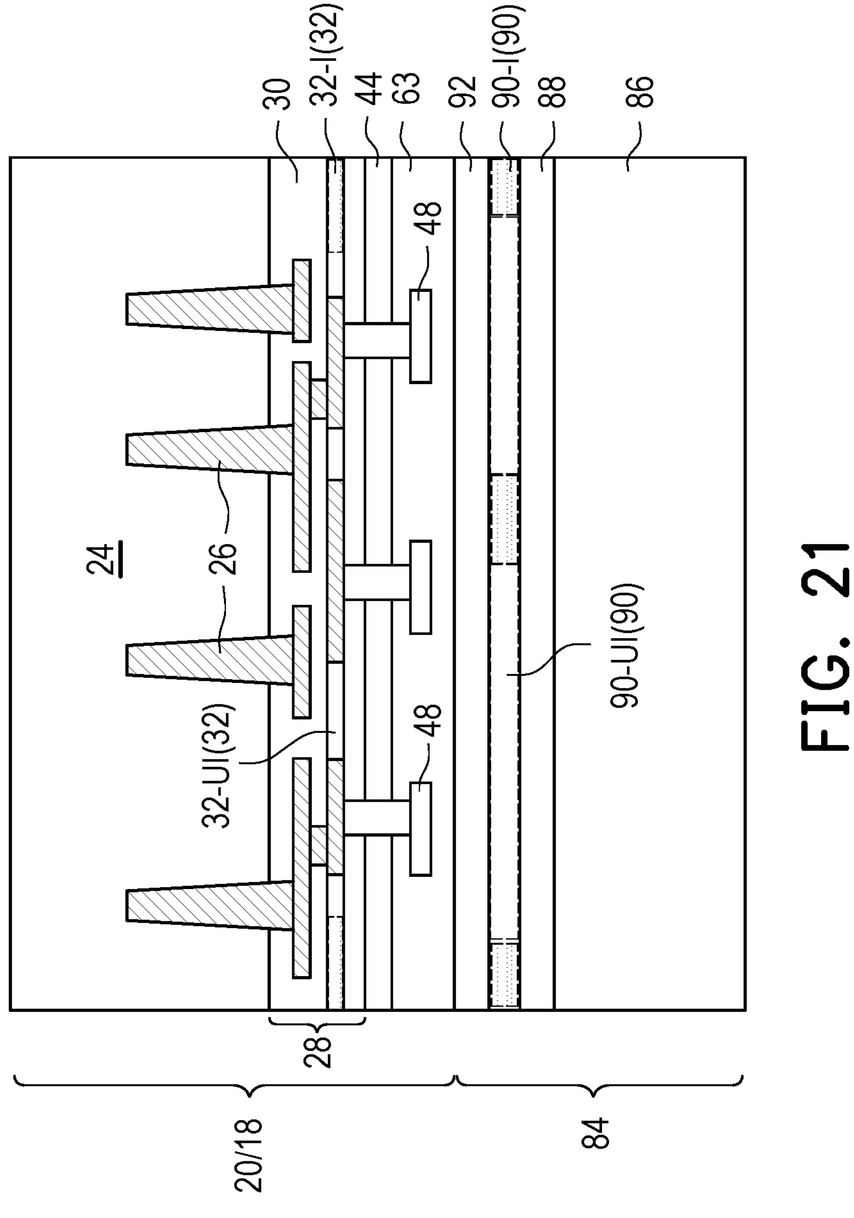
FIGS. 21-23 illustrate the cross-sectional views of intermediate stages in the formation of a package that may be used for further packaging in accordance with some embodiments.
Figure 22:
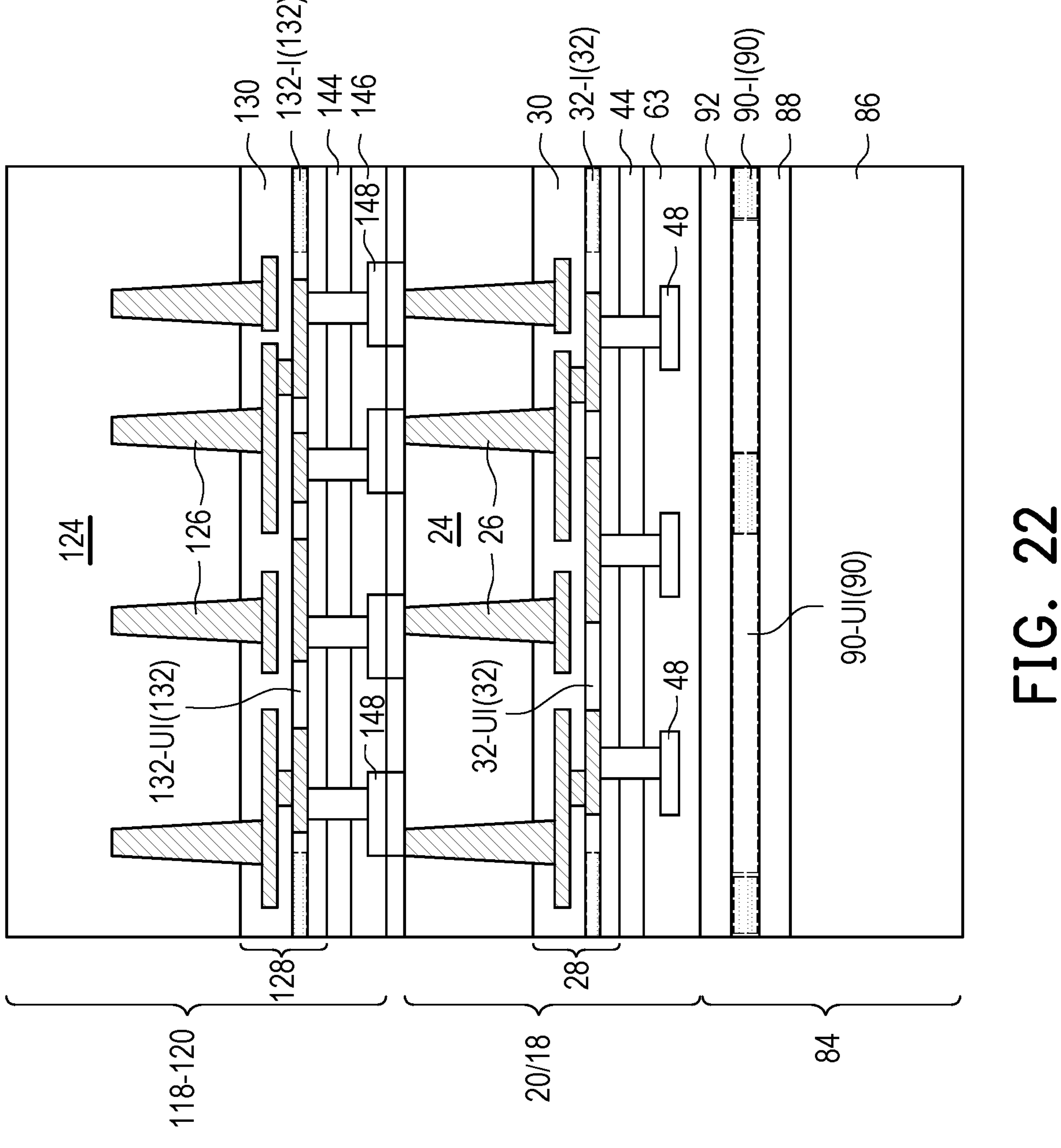
Figure 23:
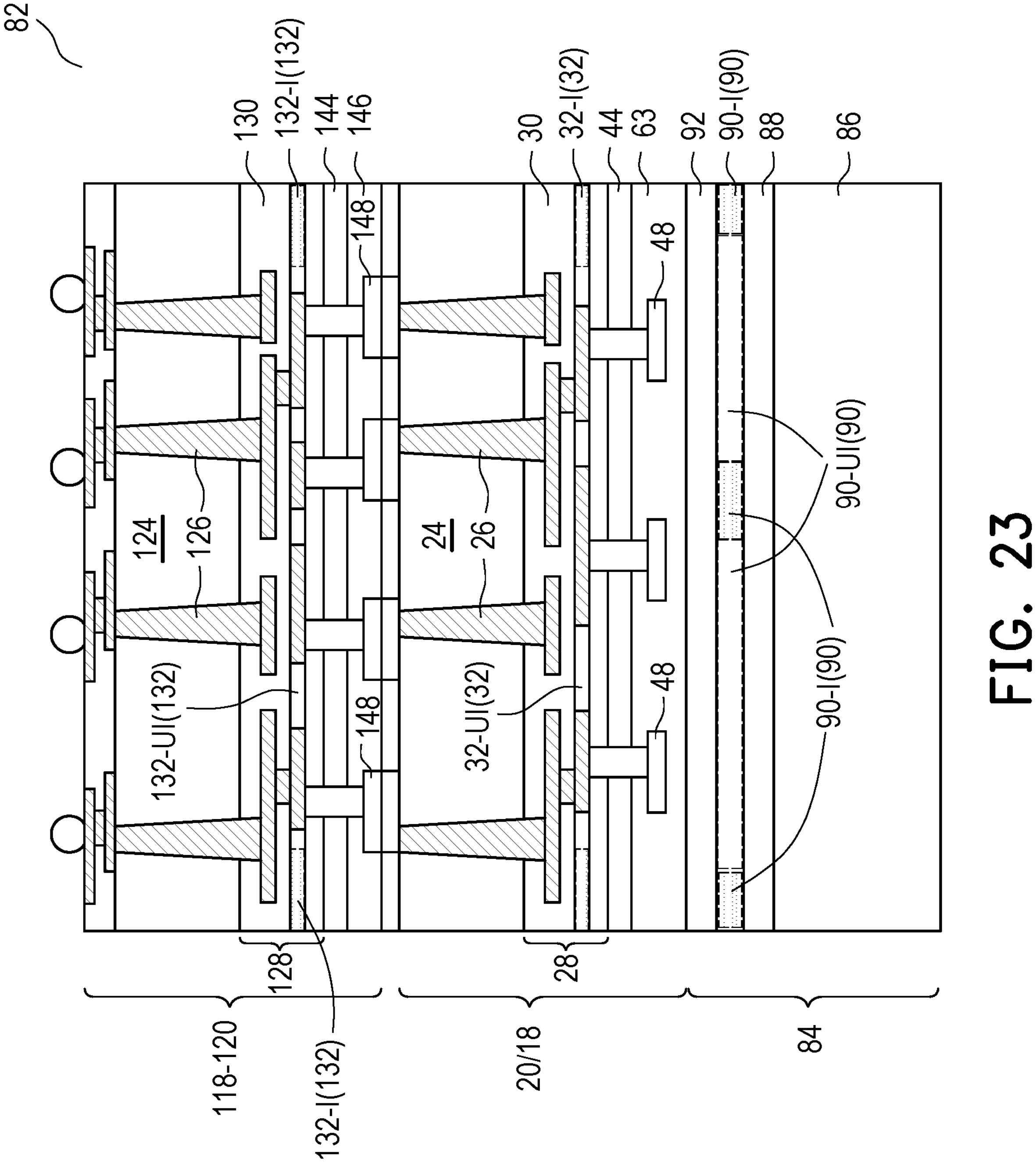

FIGS. 21-23 also illustrate a wafer-to-wafer bonding process for forming packages, which may be further packaged. Referring to FIG. 21, wafer 18 is bonded to carrier wafer 84. Next, the substrate 24 of wafer 18 is thinned to reveal through-vias 26, and a backside structure is formed on the backside of wafer 18, as shown in FIG. 22.

Further referring to FIG. 22, wafer 118 is bonded to wafer 18. In subsequent processes, the substrate 124 of wafer 118 is thinned to reveal through-vias 126, and a backside structure is formed on the backside of wafer 118 to form reconstructed wafer 82, as shown in FIG. 23. The resulting reconstructed wafer 82 may then be singulated to form discrete packages.

In the structure show in FIG. 22, stress modulation layers/regions may be formed in one or more, or all, of carrier wafer 84, wafer 18, and wafer 118 in any combination.

Figures 32A, 32B:
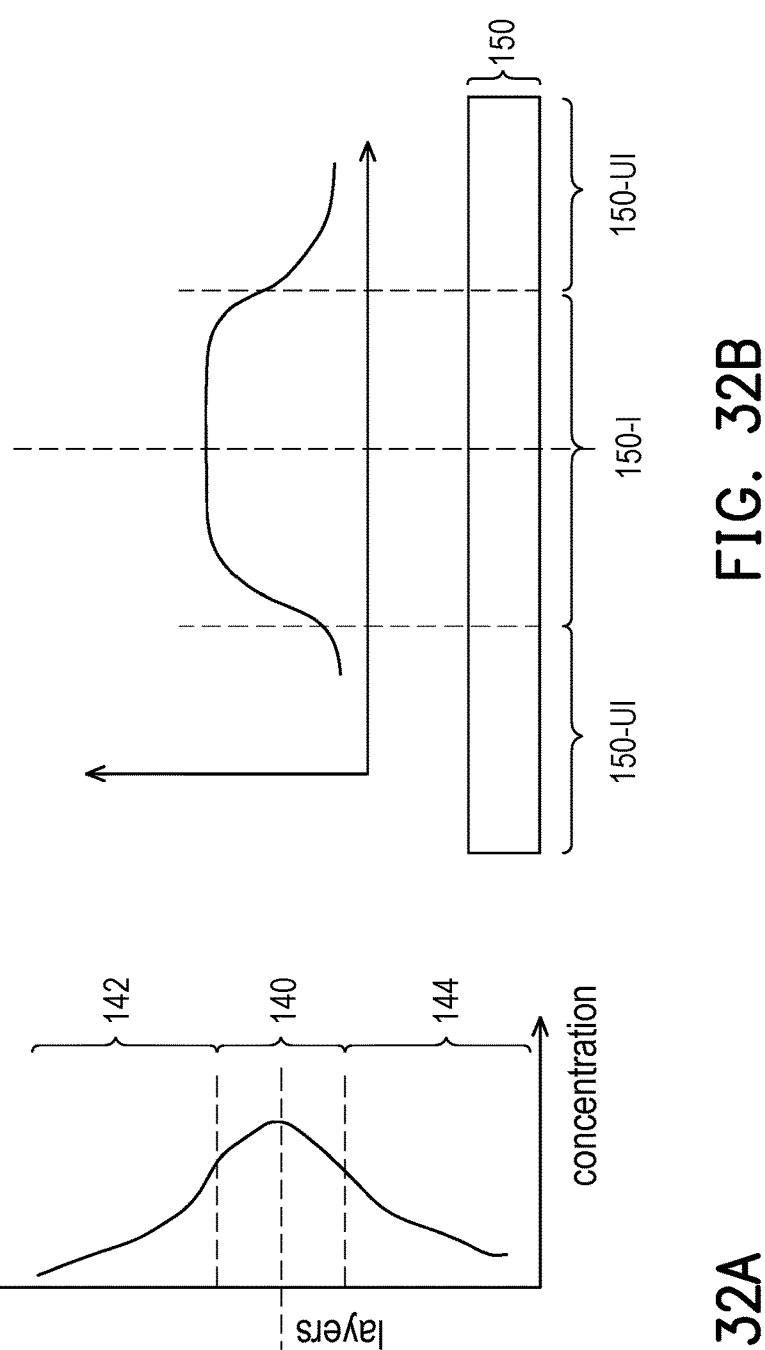
FIGS. 32A and 32B illustrate a vertical stress dopant distribution profile and a horizontal stress dopant distribution profile, respectively, in accordance with some embodiments.

FIG. 32A illustrates a vertical distribution profile of the stress modulation dopant in a stress modulation region 140, which represents any of the above-discussed stress modulation layer/regions 32-I, 44, 144, 110, and the like. Layer 142 and 144 represent the dielectric layers overlying (if any) and underlying the modulation region 140. The concentrations of the stress modulation dopant are shown on the right side of the figure. In accordance with some embodiments, the peak concentration of the stress modulation dopant is in (and may be at or close to the middle level of) the stress modulation region 140. In the upward direction and downward direction from where the peak concentration occurs, the concentrations of the stress modulation dopant may gradually reduce.

FIG. 32B illustrates a horizontal distribution of the stress modulation dopant in an implanted region 150-I in a dielectric layer 150 and un-implanted region 150-UI. Dielectric layer 150 may represent any of the above-discussed selectively implanted stress modulation layer/regions. In accordance with some embodiments, the peak concentration of the stress modulation dopant is in (and may be at or close to the middle of) the implanted region 150-I. The concentrations of the stress modulation dopant may gradually reduce going into the un-implanted region 150-UI. Some portions of the un-implanted region 150-UI may be free from the stress modulation dopant.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming stress modulation layers/regions through ion implantation in dies and/or wafers, the warpage of the device dies and/or wafers may be reduced, and the warpage profiles may be modified.

In accordance with some embodiments of the present disclosure, a method comprises depositing a dielectric layer on a package component having a first warpage; and performing an implantation process to implant the dielectric layer with a stress modulation dopant, wherein after the implantation process, the package component has a second warpage smaller than the first warpage. In an embodiment, the implantation process results in the package component to warp to an opposite direction than before the implantation process. In an embodiment, the implantation process is a blanket implantation process.

In an embodiment, the method further comprises forming a via penetrating through the dielectric layer; forming a bond layer over and contacting the dielectric layer; and forming a bond pad in the bond layer and over and contacting the via. In an embodiment, the implantation process is a selective implantation process, with a first portion of the dielectric layer being implanted, and wherein in the implantation process, a second portion of the dielectric layer is masked from the implantation process. In an embodiment, the method further comprises measuring the first warpage of an additional package component having an identical structure as the package component; and determining locations of the dielectric layer to be implanted, wherein the determining the locations is based on the first warpage, and wherein in the implantation process, the locations are implanted.

In an embodiment, parts of the locations that are implanted are in corner regions of the package components, and wherein a center part of the package component is masked from the implantation process. In an embodiment, the package component comprises metal lines in the dielectric layer, and wherein the metal lines are masked from the implantation process. In an embodiment, the stress modulation dopant is selected from the group consisting of Ge, B, P, As, Ga, H, Y, Zr, Xe, In, Sb, Si, N, O, C, F, Ne, He, Ar, Kr, Cl, S, Se, Sn, Al, In, Er, Yb, and combinations thereof. In an embodiment, the stress modulation dopant is selected from the group consisting of Ge, B, P, As, Ga, and combinations thereof. In an embodiment, the package component comprises active devices, and wherein the dielectric layer is on a front side of the package component. In an embodiment, the package component comprises active devices, and wherein the dielectric layer is on a backside of the package component.

In accordance with some embodiments of the present disclosure, a structure comprises a first dielectric layer; a second dielectric layer over and contacting the first dielectric layer, wherein the second dielectric layer comprises a first portion comprising a stress modulation dopant therein, wherein the first portion of the stress modulation dopant has a first peak concentration in the second dielectric layer; and a second portion, wherein the second portion of the stress modulation dopant has a second peak concentration in the second dielectric layer, and the second peak concentration is lower than the first peak concentration; and a third dielectric layer over the second dielectric layer.

In an embodiment, from a position where the first peak centration occurs and going upwardly into the third dielectric layer, or downwardly into the first dielectric layer, concentrations of the stress modulation dopant continuously reduce, and wherein from the first portion to the second portion, the concentrations of the stress modulation dopant also continuously reduce. In an embodiment, the stress modulation dopant is selected from the group consisting of Ge, B, P, As, Ga, H, Y, Zr, Xe, In, Sb, Si, N, O, C, F, Ne, He, Ar, Kr, Cl, S, Se, Sn, Al, In, Er, Yb, and combinations thereof.

In an embodiment, the stress modulation dopant is selected from the group consisting of Ge, B, P, As, Ga, and combinations thereof. In an embodiment, the structure further comprises a metal line in the second dielectric layer, wherein the metal line is in the second portion. In an embodiment, the first dielectric layer, the second dielectric layer, and the third dielectric layer are comprised in a die, and wherein the first portion is in a corner region of the die, and the second portion is in a center region of the die.

In accordance with some embodiments of the present disclosure, a structure comprises a semiconductor substrate; active devices in the semiconductor substrate; an interconnect structure over the active devices, wherein the interconnect structure comprises a passivation layer comprising first portions and second portions, wherein the first portions comprise a stress modulation dopant, and the second portions have at least lower concentrations of the stress modulation dopant than the first portions; and a plurality of conductive features in the passivation layers, wherein each of the plurality of conductive features is encircled by one of the second portions of the passivation layer, and is spaced apart from the first portions; and a bond layer over the passivation layer. In an embodiment, peak concentrations of the stress modulation dopant are in the passivation layer, and in an upward direction and a downward direction starting from where the peak concentrations occur, concentrations of the stress modulation dopant gradually reduce.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

depositing a dielectric layer on a package component having a first warpage; and performing an implantation process to implant the dielectric layer with a stress modulation dopant, wherein after the implantation process, the package component has a second warpage smaller than the first warpage.

2. The method of claim 1, wherein the implantation process results in the package component to warp to an opposite direction than before the implantation process.

3. The method of claim 1, wherein the implantation process is a blanket implantation process.

4. The method of claim 3 further comprising:

forming a via penetrating through the dielectric layer;

forming a bond layer over and contacting the dielectric layer; and forming a bond pad in the bond layer and over and contacting the via.

5. The method of claim 1, wherein the implantation process is a selective implantation process, with a first portion of the dielectric layer being implanted, and wherein in the implantation process, a second portion of the dielectric layer is masked from the implantation process.

6. The method of claim 5 further comprising:

measuring the first warpage of an additional package component having an identical structure as the package component; and determining locations of the dielectric layer to be implanted, wherein the determining the locations is based on the first warpage, and wherein in the implantation process, the locations are implanted.

7. The method of claim 5, wherein parts of the locations that are implanted are in corner regions of the package component, and wherein a center part of the package component is masked from the implantation process.

8. The method of claim 5, wherein the package component comprises metal lines in the dielectric layer, and wherein the metal lines are masked from the implantation process.

9. The method of claim 1, wherein the stress modulation dopant is selected from the group consisting of Ge, B, P, As, Ga, H, Y, Zr, Xe, In, Sb, Si, N, O, C, F, Ne, He, Ar, Kr, Cl, S, Se, Sn, Al, In, Er, Yb, and combinations thereof.

10. The method of claim 9, wherein the stress modulation dopant is selected from the group consisting of Ge, B, P, As, Ga, and combinations thereof.

11. The method of claim 1, wherein the package component comprises active devices, and wherein the dielectric layer is on a front side of the package component.

12. The method of claim 1, wherein the package component comprises active devices, and wherein the dielectric layer is on a backside of the package component.

13. A method comprising:

forming a first dielectric layer;

forming a second dielectric layer over and contacting the first dielectric layer;

performing a doping process on the second dielectric layer, so that the second dielectric layer comprises:

a first portion comprising a stress modulation dopant therein, wherein the first portion of the stress modulation dopant is doped through the doping process to have a first peak concentration; and a second portion, wherein the second portion of the stress modulation dopant has a second peak concentration in the second dielectric layer, and the second peak concentration is lower than the first peak concentration; and a third dielectric layer over the second dielectric layer.

14. The method of claim 13, wherein the doping process comprises an implantation process to implant the stress modulation dopant into the first portion of the second dielectric layer.

15. The method of claim 13, wherein the stress modulation dopant is selected from the group consisting of Ge, B, P, As, Ga, H, Y, Zr, Xe, In, Sb, Si, N, O, C, F, Ne, He, Ar, Kr, Cl, S, Se, Sn, Al, In, Er, Yb, and combinations thereof.

16. The method of claim 15, wherein the stress modulation dopant is selected from the group consisting of Ge, B, P, As, Ga, and combinations thereof.

17. The method of claim 13 further comprising forming a metal line in the second portion of the second dielectric layer.

18. The method of claim 13, wherein the first dielectric layer, the second dielectric layer, and the third dielectric layer are comprised in a die, and wherein the first portion is in a corner region of the die, and the second portion is in a center region of the die.

19. A method comprising:

forming active devices in a substrate;

forming an interconnect structure over the active devices, wherein the interconnect structure are formed using processes comprising:

forming a passivation layer comprising first portions and second portions, wherein the first portions are implanted with a stress modulation dopant, and the second portions have at least lower concentrations of the stress modulation dopant than the first portions; and forming a plurality of conductive features in the passivation layer, wherein each of the plurality of conductive features is encircled by one of the second portions of the passivation layer, and is spaced apart from the first portions; and forming a bond layer over the passivation layer.

20. The method of claim 19, wherein peak concentrations of the stress modulation dopant are in the passivation layer, and in an upward direction and a downward direction starting from where the peak concentrations occur, concentrations of the stress modulation dopant gradually reduce.

* * * * *